(12) United States Patent
Girard, Jr. et al.

(10) Patent No.: US 8,241,067 B2
(45) Date of Patent: Aug. 14, 2012

(54) SURFACE MOUNT FOOTPRINT IN-LINE CAPACITANCE

(75) Inventors: Donald A. Girard, Jr., Bedford, NH (US); Mark W. Gailus, Concord, MA (US); Philip T. Stokoe, Attleboro, MA (US)

(73) Assignee: Amphenol Corporation, Wallingford Center, CT (US)

( * ) Notice: Subject to any disclaimer, the term of this patent is extended or adjusted under 35 U.S.C. 154(b) by 314 days.

(21) Appl. No.: 12/612,510

(22) Filed: Nov. 4, 2009

(65) Prior Publication Data

US 2011/0104948 A1  May 5, 2011

(51) Int. Cl.
*H01R 13/66* (2006.01)
(52) U.S. Cl. .................................... 439/620.21
(58) Field of Classification Search ............ 439/620.21, 439/620.05–620.07, 620.09–620.14, 637, 439/65, 80, 83, 60, 62, 108, 101, 607.05; 361/768; 174/262, 260; 29/840
See application file for complete search history.

(56) References Cited

U.S. PATENT DOCUMENTS

| | | | |
|---|---|---|---|
| 5,035,631 A | 7/1991 | Piorunneck et al. | |
| 5,257,950 A * | 11/1993 | Lenker et al. | 439/620.12 |
| 5,702,258 A | 12/1997 | Provencher et al. | |
| 5,709,555 A | 1/1998 | Noschese | |
| 6,042,386 A | 3/2000 | Cohen et al. | |
| 6,152,742 A | 11/2000 | Cohen et al. | |
| 6,776,661 B2 * | 8/2004 | Dingenotto et al. | 439/620.09 |
| 2005/0048842 A1 | 3/2005 | Benham et al. | |
| 2008/0045087 A1 | 2/2008 | Mickievicz et al. | |
| 2010/0048040 A1 * | 2/2010 | Straka et al. | 439/55 |

OTHER PUBLICATIONS

International Search Report corresponding to PCT/US2010/0550250, dated Apr. 25, 2011.

* cited by examiner

*Primary Examiner* — Edwin A. Leon
(74) *Attorney, Agent, or Firm* — Wolf, Greenfield & Sacks, P.C.

(57) ABSTRACT

An interconnection system with capacitors integrated into a printed circuit board footprint of an electrical connector. One end of each capacitor shares a pad on the printed circuit board with a contact tail of a conductive element in a connector. The shared pads are not connected through vias to internal circuit structures. Rather, a via, such as which would conventionally be formed as part of the connector mounting pad, is formed as part of a separate, adjacent pad. A second end of the capacitor is attached to the adjacent pad, forming an electrical connection between the conductive element and the via through the capacitor. Incorporating capacitors into the footprint reduces the number of vias required, which improves signal integrity. The capacitors may be placed on the printed circuit board separately from the connector or may be incorporated into the connector, allowing the connector and capacitors to be placed in one operation.

29 Claims, 16 Drawing Sheets

SURFACE MOUNT FOOTPRINT IN-LINE CAPACITANCE

BACKGROUND

This invention relates generally to electrical interconnections for connecting printed circuit boards.

Electrical connectors are used in many electronic systems. It is generally easier and more cost effective to manufacture a system on several printed circuit boards ("PCBs") that are connected to one another by electrical connectors than to manufacture a system as a single assembly. A traditional arrangement for interconnecting several PCBs is to have one PCB serve as a backplane. Other PCBs, which are called daughter boards or daughter cards, are then connected through the backplane by electrical connectors.

Electronic systems have generally become smaller, faster and functionally more complex. These changes mean that the number of circuits in a given area of an electronic system, along with the frequencies at which the circuits operate, have increased significantly in recent years. Current systems pass more data between printed circuit boards and require electrical connectors that are electrically capable of handling more data at higher speeds than connectors of even a few years ago.

In some instances, differential connectors are used to carry high speed data. Examples of differential electrical connectors are shown in U.S. Pat. No. 6,293,827, U.S. Pat. No. 6,503,103, U.S. Pat. No. 6,776,659, and U.S. Pat. No. 7,163,421, all of which are assigned to the assignee of the present application and are hereby incorporated by reference in their entireties.

Printed circuit board design also contributes to the ability of an interconnection system to carry multiple high speed signals. Printed circuit boards are manufactured with layers of conductive traces that form microstrip transmission lines. Each microstrip transmission line generally has a uniform impedance, allowing even a high frequency signal to propagate along it with relatively low loss or distortion.

To make connections between microstrip transmission lines on different layers or between microstrip transmission lines within the printed circuit board and components on the surface, of the printed circuit boards, vias are formed. Vias are formed by drilling a hole fully or partially through the printed circuit board and plating the hole with a conductive material. Unfortunately, the via creates a disruption in the uniform impedance of the microstrip transmission line and therefore diminishes the integrity with which signals are propagated. Consequently, techniques have been developed to reduce the size of vias or to eliminate the need for vias altogether. For example, it is known to route traces associated with signals that are to be connected together on the same layer of a printed circuit board so that they can be interconnected without vias. It is also known to route traces carrying high frequency signals on the surface of the printed circuit board to enable connections to be made to the traces without the need for vias. It is also known to decrease the size of vias, such as by backdrilling, which involves drilling away portions of the via after it is formed, or by using buried vias or blind vias, which involve forming vias only a portion of the way through a printed circuit board.

It is also known to improve signal integrity of electronic systems through the use of capacitors attached to signal lines. Capacitors block the flow of low frequency signals, which, in a high frequency system, may be noise. Capacitors may also be connected adjacent inductive segments along a signal conductor to counteract the effect of the inductive segment on the impedance of the signal conductor.

SUMMARY OF INVENTION

The inventors have recognized and appreciated that for electrical interconnection systems in which electronic components, such as capacitors, are connected in signal paths, improved signal integrity and routability may be achieved by incorporating the capacitors within the footprint of a surface mount electrical connector. One end of each capacitor may be connected to a shared conductive mounting pad on a printed circuit board (PCB) that is also used for attaching a contact tail of a conductive element of the electrical connector to the PCB. A second end of each capacitor may be attached to a second conductive mounting pad containing a via, as would conventionally exist in a mounting pad in an electrical connector footprint. The capacitor spans the shared mounting pad and the second mounting pad, connecting the conductive element of the connector to a trace within the printed circuit board through the capacitor.

Sharing a mounting pad for a contact and an end of a capacitor allows the capacitor to be integrated into a signal path through the interconnection system, using as few as one via to both mount the capacitor and connect a conductive element to the printed circuit board. As a result, signal integrity may be improved because of the elimination of discontinuities in signal paths that would otherwise be introduced by vias used for attaching the capacitors. Routability is also improved because the total number of vias used in mounting the connector and capacitors may be reduced. In some embodiments, a capacitor is placed on mounting pads in a connector footprint prior to the connector being placed on the printed circuit board. In other embodiments, capacitors are attached to the connector and subsequently, the connector and capacitor assembly are simultaneously placed on mounting pads of the connector footprint. In either event, the connector housing may be shaped with recesses or other features that enable the connector to be appropriately mounted to the printed circuit board despite the capacitors in the footprint. In embodiments in which the connector is made of wafer subassemblies, the capacitor may be partially or fully contained within space between adjacent wafer assemblies. In some illustrative embodiments, the invention relates to an electronic assembly comprising a printed circuit board, a plurality of electronic components and an electrical connector. The printed circuit board has a surface with a plurality of conductive pads disposed thereon and a plurality of conductive traces within the printed circuit board. The electrical connector has a housing and a plurality of conductive elements within the housing, each of the plurality of conductive elements comprising a surface mount contact tail extending from the housing. The housing is disposed adjacent to an area of the surface containing at least a portion of the plurality of conductive pads. The surface mount contact tail of each of the plurality of conductive elements is electrically connected to a pad of a first portion of the plurality of conductive pads. Each of the electronic components has a first end and a second end. The first end of each of the plurality of electronic components is electrically connected to a pad of the first portion of the plurality of conductive pads and the second end of each of the plurality of electronic components is electrically connected to a pad of a second portion of the plurality of conductive pads. The assembly has a plurality of vias, each passing through a conductive pad of the second portion of the plurality of conductive pads and a conductive trace of the plurality of conductive traces. In another illustrative embodiment, the invention relates to an electrical connector comprising a housing having a surface. A plurality of conductive elements each have an intermediate portion disposed within the housing and a contact tail extending from the housing adjacent the surface. A plurality of electronic components is attached to the surface of the housing. Each of the plurality of electronic components comprises a conductive surface, and each of the plurality of components is disposed with the conductive surface adjacent a contact tail of a conductive element of the plurality of conductive elements.

In a further illustrative embodiment, the invention relates to a method of manufacturing a printed circuit board. The method involves placing a plurality of capacitors on the printed circuit board, each capacitor spanning a respective first mounting pad and a respective second mounting pad within a footprint of an electrical connector. Each second mounting pad is coupled through a via to a conductive structure within the printed circuit board. An electrical connector is placed within the footprint. The electrical connector comprises a plurality of conductive elements and is placed with conductive elements of the plurality of conductive elements aligned with a respective first mounting pad. The method additionally includes soldering the plurality of conductive elements to the respective first mounting pad and soldering each of the plurality of capacitors to the respective first mounting pad and second mounting pad, whereby a permanent electrical connection is made between each of the plurality of conductive elements and a conductive structure of the plurality of conductive structures within the printed circuit board through a capacitor of the plurality of capacitors.

In yet another illustrative embodiment, the invention relates to a printed circuit board comprising a component footprint. The component footprint comprises a plurality of columns, with each column comprising a plurality of first pairs and second pairs of conductive pads disposed on a surface of the printed circuit board. Each first pair comprises two adjacent pads and a via disposed in each pad. Each second pair comprises two pads, wherein each of the second pairs of conductive pads comprises two adjacent pads without a via disposed in either pad. A plurality of conductive strips are disposed on the surface of the printed circuit board, each conductive strip disposed between two adjacent first pairs of conductive pads and between two adjacent second pairs of conductive pads.

Other advantages and novel features of the present invention will become apparent from the following detailed description of various non-limiting embodiments of the invention when considered in conjunction with the accompanying figures and from the claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

The inventors have recognized and appreciated that an improved electronic interconnection system may be formed by placing electronic components, described as capacitors in exemplary embodiments herein, on conductive pads of a substrate, described as a PCB in illustrative embodiments herein, that are within the footprint of a component, described as an electrical connector in illustrative embodiments herein, to be mounted to the PCB. Ends of the capacitors may be connected to pads within the footprint for establishing electrical pathways between signal conductors within the connector and the PCB, which is described in exemplary embodiments as a backplane, but may be a daughter card or other suitable substrate.

A footprint on the PCB may have mounting pads positioned where contact tails of signal conductors within the connector may be suitably connected to the PCB. However, not all mounting pads may be in direct connection with a via in the PCB. The footprint pattern may allow for capacitors to be connected to the PCB in a manner that reduces the number of conductive vias used. For example, in some cases where past footprint patterns have called for three conductive vias to provide a particular electrical path, footprint patterns described herein may provide for only one conductive via for similar applications. Such a configuration may be achieved by sharing a pad between each a tail and one end of a capacitor. A shared pad may be free of vias. A second pad, to which a second end of the capacitor is attached, may be connected to a signal trace within the PCB through a via.

Capacitors may be placed on the PCB before the connector or may be coupled to the connector so that they are placed concurrently with the connector. In one approach, a capacitor is appropriately aligned and placed on mounting pads of a PCB footprint. Subsequently, contact tails of an appropriately aligned connector are placed adjacent to a conductive region of the capacitor on a shared mounting pad, which provides for a suitable electrical pathway through the capacitor once the capacitor and connector are suitably connected with the board, using a reflow soldering operation, conductive adhesive or other suitable approach. As a result, the connector is suitably connected with the PCB. In another approach, the capacitor is attached to the connector housing first, for example, with a suitable adhesive such as high temperature compatible glue. The connector and capacitor assembly is then suitably aligned and placed on the mounting pad of the footprint for establishing a desired electrical connection between the PCB and the connector. In both of the above approaches, the final orientation of the PCB, the capacitor, and the connector may be the same. The PCB is connected to the capacitor and the connector in a manner that reduces the number of conductive vias through the board, hence, providing additional space within layers of the PCB.

Figure 1:
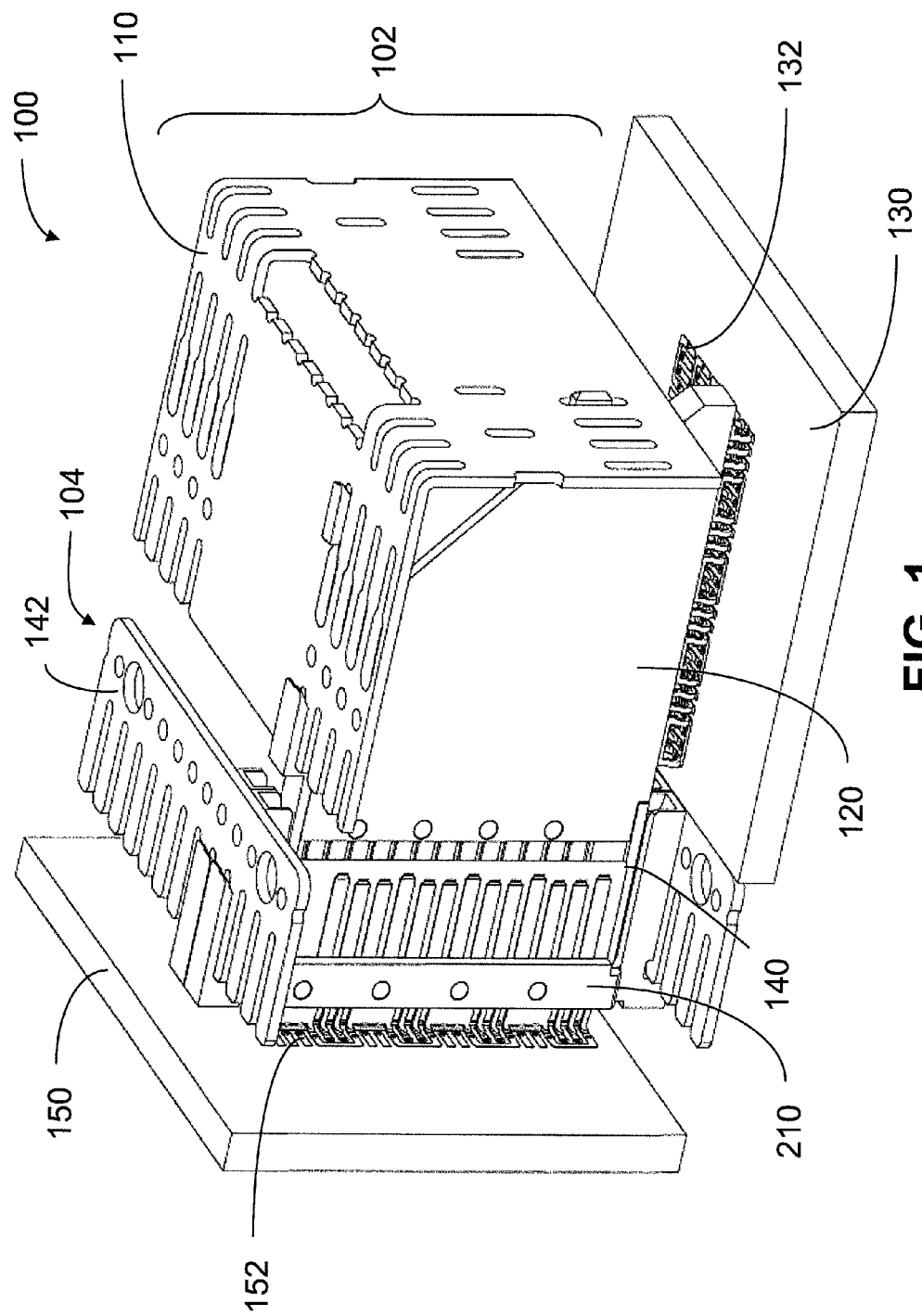
FIG. 1 is a perspective view of a portion of an electrical interconnection system according to some embodiments of the present invention.
Figure 2:
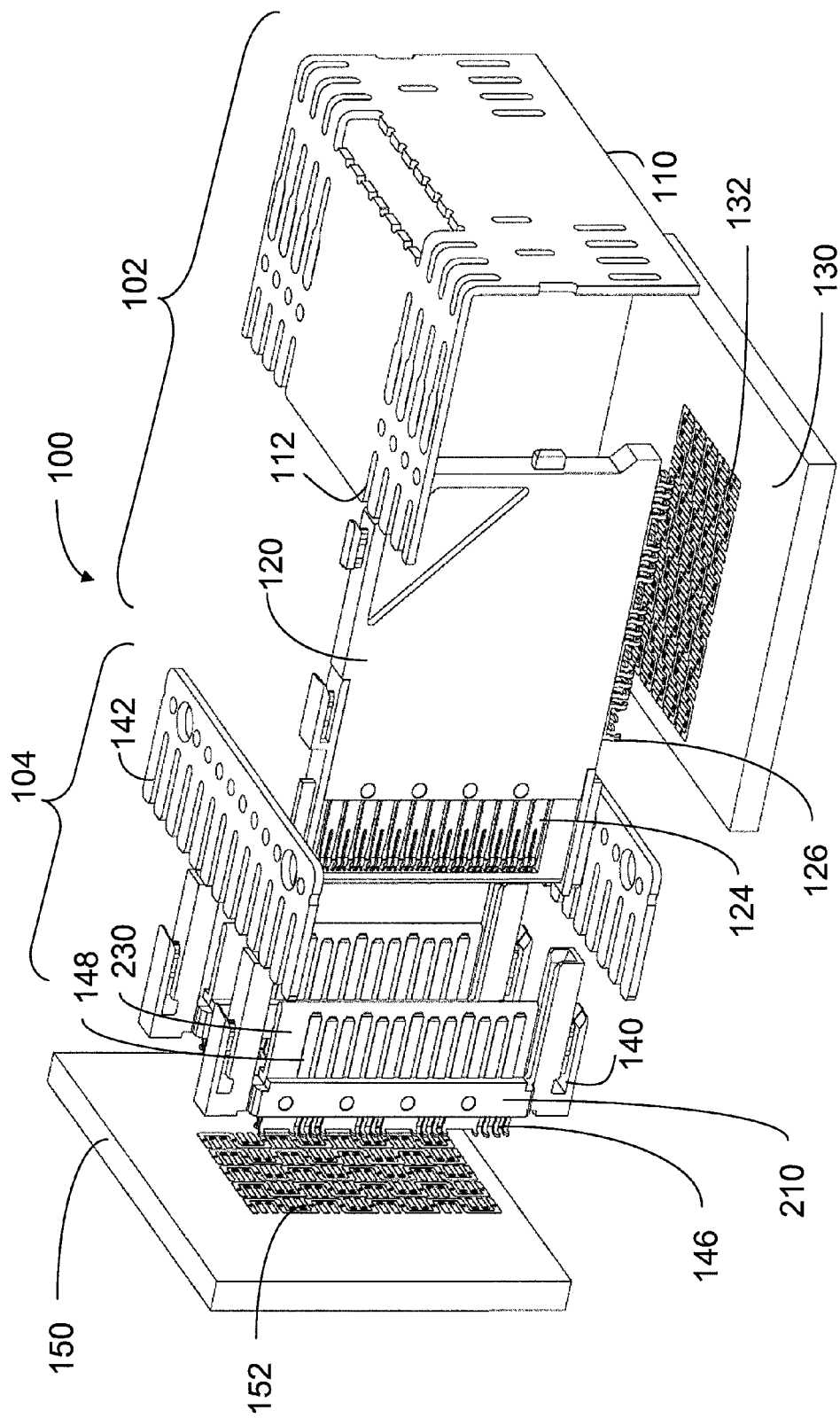
FIG. 2 is an exploded perspective view of the electrical interconnection system of FIG. 1.

Referring to FIGS. 1 and 2, an illustrative portion of electrical interconnection system 100 is shown. The electrical interconnection system 100 includes a daughter card connector 102 and a backplane connector 104, each of which is attached to a substrate to be connected through interconnection system 100. In this example, daughter card connector 102 is attached to a PCB configured as a daughter card 130. Backplane connector 104 is attached to a PCB configured as a backplane 150.

Daughter card connector 102 is designed to mate with backplane connector 104, creating electronically conducting paths between conductive elements within backplane 150 and daughter card 130. Those conducting elements may carry signals or reference voltages, such as power and ground. By interconnecting daughter card 130 and backplane 150 through interconnection system 100, circuit paths are created that allow electronic components on daughter card 150 to function as part of a system containing backplane 150.

Though not expressly shown, interconnection system 100 may interconnect multiple daughter cards having similar connectors that mate to similar backplane connectors. As a result, an electronic system may contain multiple daughter cards or other circuit assemblies connected through backplane 150. Though, for simplicity, only one such daughter card is shown. Accordingly, the number and type of circuit assemblies connected through an interconnection system is not a limitation on the invention.

FIGS. 1 and 2 show an interconnection system using a right-angle, backplane connector. It should be appreciated that in other embodiments, an electrical interconnection system may include other types and combinations of connectors, and inventive concepts described herein may be broadly applied in many types of electrical connectors. For example, concepts described herein may be applied to other right angle connectors, mezzanine connectors, card edge connectors or chip sockets.

In the embodiment illustrated in FIG. 1, both daughter card connector 102 and backplane connector 104 are assembled from multiple subassemblies mounted in parallel. Though FIG. 1 shows the connectors only partially populated with subassemblies, a connector may be populated with any number of subassemblies, which may be mounted side-by-side. The subassemblies may be mounted with a spacing between about 1.5 and 2.5 nun. As one example, the centerline to centerline spacing between subassemblies may be approximately of 2 mm.

Each of the subassemblies contains a group of conductive elements that complete circuit paths through interconnection system 100 when the daughter card connector 102 and backplane connector 104 are mated. Consequently, the number of subassemblies in a connector may be varied in accordance with the desired number of conducting paths through the interconnection system.

In the embodiment illustrated, each of the subassemblies incorporates one or more "wafers." Each wafer has conductive elements held in a housing. In the example of FIG. 1, each wafer has a single column of conductive elements and there are two wafers per subassembly. Consequently, each wafer subassembly contains two columns of conductive elements.

Daughter card connector 102 may include a number of wafer subassemblies 120. The wafer subassemblies may be mechanically coupled in any suitable way. In the example of FIG. 1, each of the wafer subassemblies 120 is attached to a support member, illustrated as stiffener, sometimes called an "organizer," 110. Likewise, backplane connector 104 may include a number of backplane wafer subassemblies 140 mounted to stiffeners 142.

In FIG. 1, one wafer subassembly 120 and two wafer subassemblies 140 are shown for simplicity. However, any number of wafer subassemblies, each of which may be in the same form as wafer subassembly 120 or 140, may be mounted to stiffeners 110 or 142.

In some embodiments of the electrical interconnection system 100, stiffeners 110 and 142 have slots, holes, grooves or other features that engage wafer subassemblies. As shown in FIG. 2, stiffener 110 includes multiple parallel slots 112 through which attachment features of wafer subassembly 120 may be attached. Similar slots are included in stiffener 142 for attachment of backplane wafer subassemblies 140.

Wafer subassemblies may include attachment features for engaging a stiffener to locate each wafer subassembly with respect to one another and further to prevent rotation. Of course, the present invention is not limited in this regard, and no stiffener need be employed. Further, although the stiffener is shown attached to an upper and side portion of the plurality of wafer subassemblies, the present invention is not limited in this respect, as other suitable locations may be employed.

Regardless of the manner in which the wafer subassemblies are held together, the conductive elements within each of the wafer subassemblies may be in any suitable form and any number or type of conductive elements may be included. In the illustrated embodiment, conductive elements configured to carry signals are grouped in pairs. Each of the pairs in a column is separated by another conductive element configured as a ground conductor. In the embodiment illustrated, each column includes 4 such pairs. Accordingly, each wafer subassembly, such as wafer subassembly 120, may contain 8 pairs. In some embodiments, the wafer subassemblies may be spaced with a center-to-center distance on the order of 2 mm. Such a configuration results in a connector providing approximately 100 pairs per inch (40 pairs per cm). In other embodiments, other densities are provided.

Regardless of the number and function of the conductive elements, each conductive element may have a mating contact portion, a contact tail and an intermediate portion joining the two. The mating contact portions may be shaped to make electrical connection with a mating contact portion in a complementary connector. The contact tail may be shaped for attachment to a substrate, such as a printed circuit board. The intermediate portions may be shaped to convey signals through the connector without substantial attenuation, crosstalk or other distortion of the signals.

In the embodiment illustrated, each daughter card wafer subassembly 120 has a mating portion that includes the mating contact portions of the conductive elements in the wafer. The mating portion may be positioned between two backplane wafer subassemblies 140 when daughter card connector 102 is mated with backplane connector 104. Conversely, each backplane wafer subassembly 140, with the exception of backplane subassemblies situated at the ends of the backplane connector 104, may also be disposed between two wafer subassemblies 120 upon mating.

In the embodiment illustrated, all of the daughter card wafer subassemblies are substantially identical, and each has mating contacts on two opposing sides of a mating portion. The mating contacts make electrical connections to corresponding mating contacts on backplane wafer subassemblies 140. All of the wafer subassemblies in backplane connector 104 also may be substantially identical and may also have mating contacts on two sides. Though, because the wafer subassemblies at the ends of backplane connector 104 only engage with one wafer subassembly 120, those subassemblies may have a different shape than other wafer subassemblies 140. For example, the wafer subassemblies at one or both ends of connector 140 may have mating contacts on only one side. The mating contacts may be on a surface facing inwards towards the center of backplane connector 140, and there may be no mating contacts on the outward facing surface.

To make electrical connections with signal traces or other conductive elements within the daughter card connector 102 and backplane connector 104 are coupled to daughter card 130 and backplane 150 through contact tails. The conductive elements on daughter card 130 and backplane 150 are shaped and positioned to align with the contact tails from the conductive elements of daughter card connector 102 and backplane connector 104. The pattern of conductive elements on daughter card 130 or backplane 150 positioned to engage contact tails from a connector, such as connectors 102 or 104, is sometimes referred to as the connector "footprint."

In the embodiment illustrated, daughter card 130 and backplane 150 have surface mount contact tails, which are intended to be soldered to pads on the surface of a printed circuit board. Though, such contact tails may be attached to surface pads in any suitable way, including through the use of conductive adhesives or through the use of a compression mounting. Accordingly, the connector footprint includes surface pads. To make connections to conductive structures within the printed circuit board, vias may pass through the pads and intersect the conductive elements within the printed circuit board. For signal pads in the footprint, the vias intersect signal traces within the printed circuit board. Vias through ground pads in the footprint intersect ground planes within the printed circuit board.

Accordingly, FIGS. 1 and 2 illustrate a daughter card footprint 132 containing surface mount pads with vias passing through the pads to make connections to signal traces and ground planes within daughter card 120. Similarly, backplane footprint 152 contains surface mount pads with vias passing through the pads to make connections to signal traces and ground planes within backplane 150.

Conductive elements within connectors 102 and 104 shaped to carry signals may be attached to signal pads in a respective footprint that are coupled to signal traces within a printed circuit board. Likewise, conductive elements shaped to act as grounds may be connected through a foot print to ground planes within a printed circuit board. Ground planes provide reference levels for electronic components, such as those on daughter card 130. Ground planes may have voltages that are at earth ground or positive or negative with respect to earth ground, as any voltage level may act as a reference level. The conductive elements of daughter card connector 102 and backplane connector 104 may have any suitable shape. The mating contact portions of daughter card connector 102 are not visible in the view of FIG. 1. However, in the embodiment illustrated, the mating contacts of daughter card connector 102 are shaped as compliant beams. Each contact may include one or more compliant beams. For example, FIG. 2 illustrates that each mating contact includes two parallel beams.

The mating contacts in backplane connector 104 are shaped to mate with mating contacts from daughter card connector 102. In the illustrated embodiment in which the mating contacts from daughter card connector 102 are shaped as beams, the mating contacts in backplane connector 104 may be shaped to present a surface against which the compliant beams may press. For example, the mating contacts in backplane connector 104 may be shaped as blades or pads that have a flat surface that is exposed in the housing of the backplane connector.

In the example of FIGS. 1 and 2, backplane wafer subassembly 140 has a backplane housing that includes a portion 210 and a housing portion 230. These components are shaped so that the mating contact portions of the plurality of conductive elements in the backplane wafer subassembly are exposed. In the embodiment illustrated in which a each wafer subassembly includes two columns of conductive elements, one column of mating contact portions may be exposed in one of two opposing surfaces of the housing. In FIG. 2, portions of one column of conductive elements are exposed are visible. The exposed portions form mating contacts 148. In the illustrated embodiment, mating contacts 148 are in the form of blades, although other suitable contact configurations may be employed, as the present invention is not limited in this regard.

FIG. 2 also illustrates tail portions of the conductive contacts within each of daughter card connector 102 and backplane connector 104. Tail portions of daughter card connector 102, shown collectively as contact tails 126, extend below a housing of each of the daughter card wafers and are adapted to be attached to daughter card 130. Tail portions of backplane connector 104, shown collectively as contact tails 146, extend below the backplane housing portion 210 and are adapted to be attached to backplane 150. Here, the contact tails 126 and 146 are surface mount contacts and are in the form of curved leads adapted to be soldered onto contact pads of daughter card footprint 132 or backplane footprint 152 using a suitable mechanism, such as a reflow, heat attach or cure operation. However, other configurations are also suitable, such as other shapes of surface mount element contacts, spring contacts, solderable pins, press fits, etc., as the present invention is not limited in this regard.

The components of interconnection system 100 may be formed of any suitable material and in any suitable way. In some embodiments, the housing portions of both daughter card subassemblies and backplane subassemblies may be molded of an insulative material. Examples of suitable materials are liquid crystal polymer (LCP), polyphenyline sulfide (PPS), high temperature nylon or polypropylene (PPO). Other materials known to be used in manufacture of electrical connectors, as well as any other suitable materials, may be employed, as the present invention is not limited in this regard.

In some embodiments, the housing portions may be formed using a binder that incorporates one or more fillers that may be included to control the electrical or mechanical properties of the housing. The above-mentioned materials as well as epoxies and other materials are suitable for use as binder materials in manufacturing connectors according to some embodiments of the invention. For example, thermoplastic PPS filled to 30% by volume with glass fiber may be used to form the backplane connector structure. Such materials may be molded to form housings for the connectors. In some embodiments, such materials may be molded around some or all of the conductive elements in the connector in an insert molding operation. However, any suitable manufacturing techniques may be used to form connectors according to embodiments of the invention.

In some embodiments, some of the housing components may be formed to provide electrically lossy portions positioned at locations to provide preferential attenuation of crosstalk or other noise. Such portions may be formed using partially conductive fillers in an insulative housing. Though, such portions may be formed in any suitable way. The conductive elements of each connector may also be formed of any suitable material, including materials traditionally used in the manufacture of electrical connector. In some embodiments, the conductive elements are metal. Examples of suitable metals include phosphor-bronze, beryllium-copper and other copper alloys. Conductive elements may be stamped and formed from sheets of such materials or manufactured in any other suitable way.

To facilitate the manufacture of wafers, signal conductors and ground conductors may be stamped to be held together by one or more carrier strips (not shown) until a housing is molded over the conductive elements. In some embodiments, the signal conductors and ground conductors are stamped for many wafers on a single long sheet. The sheet may be metal or may be any other material that is conductive and provides suitable mechanical properties for making a conductive element in an electrical connector. Phosphor-bronze, beryllium copper and other copper alloys are example of materials that may be used.

Conductive elements may be retained in a desired position by the carrier strips and may be readily handled during manufacture of wafers. Once housing material is molded around the conductive elements, the carrier strips may be severed to separate the conductive elements into individual conductors, each of which may be shaped to carry a signal or a reference potential (ground) through the interconnection system.

Ground conductors and signal conductors can be formed in any appropriate manner. For example, the respective conductors may be formed as two separate lead frames, which may be overlaid prior to molding of a housing around the conductive elements. As another example, no lead frame may be used and individual conductive elements may be employed during manufacture. It should be appreciated that molding over one or both lead frames or the individual conductive elements need not be performed at all, as a wafer may be assembled by inserting ground conductors and signal conductors into preformed housing portions, or in any other suitable fashion.

In some embodiments, stiffeners 110 and 142 may be stamped metal members. Though, it can be appreciated that a support member may be made from any appropriate material for suitably providing structure. For example, support members may be formed of any of the dielectric materials that could be used for form a connector housing.

The wafer subassembly 120 can be assembled according to any suitable technique. For example, wafers may have a housing and a column of conductive elements. Columns may include conductive elements shaped to act as signal conductors and conductive elements shaped to act as ground conductors. Ground conductors may be positioned within wafers to minimize crosstalk between signal conductors or to otherwise control the electrical properties of the connector. Signal conductors may be positioned in pairs configured to carry differential signals and ground conductors are positioned adjacent each pair.

Groups of contact tails in adjacent columns within wafer subassembly 120 may partially overlap. In some embodiments, contact tails of ground conductors in a column may align with contact tails of ground conductors in an adjacent column. In addition, contact tails associated with each pair of signal conductors may align with a space between two groups in an adjacent column. When multiple wafer subassemblies are aligned side-by-side to form a connector, patterns may repeat from column to column across the connector. Such configurations may contribute to a compact footprint that enables a high density connector.

As shown, contact tails 126 are shaped in a hooked configuration where the end curves outward and back to form a surface that suitably provides for electrical communication to conductive pads on daughter card 130. In FIG. 1, contact tails 126 form an electrical connection with daughter card 130 by being soldered to daughter card footprint 132 using a surface mount printed circuit board manufacturing process. Though, any suitable method may be used for attaching a connector to a substrate, and the contact tails may be shaped appropriately for the specific manufacturing process to be used to attach a connector to a printed circuit board or other substrate.

In some embodiments, the contact tails of all of the conductive elements in a wafer subassembly may be the same shape and may be aligned in the same direction. However, in some embodiments of a daughter card wafer subassembly, the distal ends of the pad-shaped portions of the conductive elements in adjacent columns face in opposite directions. For example, as illustrated, the distal, or toe, portion of the contact tails in adjacent columns of a wafer face towards each other.

Pad-shaped portions at the ends of the contact tails may be of different sizes. For example, pad-shaped portions for contact tails associated with ground conductors are shorter than for those associated with signal conductors. Because of the orientation of groups of conductors and the size of the ground contact tails, it is possible for contact tails associated with ground conductors in adjacent columns to be attached to the same pad. As a result, the illustrated configuration leads to a compact connector footprint.

In the embodiments illustrated, the conductive elements acting as signal conductors are grouped in pairs in a configuration suitable for use as a differential electrical connector. However, embodiments are possible for single-ended use in which the conductive elements are evenly spaced without designated ground conductors separating signal conductors or with a ground conductor between each signal conductor.

Some or all of the construction techniques employed within a wafer subassembly 120 for providing desirable electrical and mechanical characteristics may be employed in backplane wafer subassembly 140. Backplane wafer subassembly 140, like wafer subassembly 120, may include features for providing desirable signal transmission properties. Signal conductors in backplane wafer subassembly 140 may be arranged in columns, each containing differential pairs interspersed with ground conductors. The ground conductors may be wide relative to the signal conductors. Also, adjacent columns may have different configurations. In some embodiments, a pair of signal conductors in one column may be aligned with a ground conductor in another column. For example, a signal pair in one column may be closer to a ground conductor than a signal pair in adjacent columns. Although the ground conductors do not align from column to column, contact tails from ground conductors in one column may align with contact tails from ground conductors in an adjacent column to facilitate attachment of ground conductors in adjacent columns on the same pad of the connector footprint.

Figure 3:
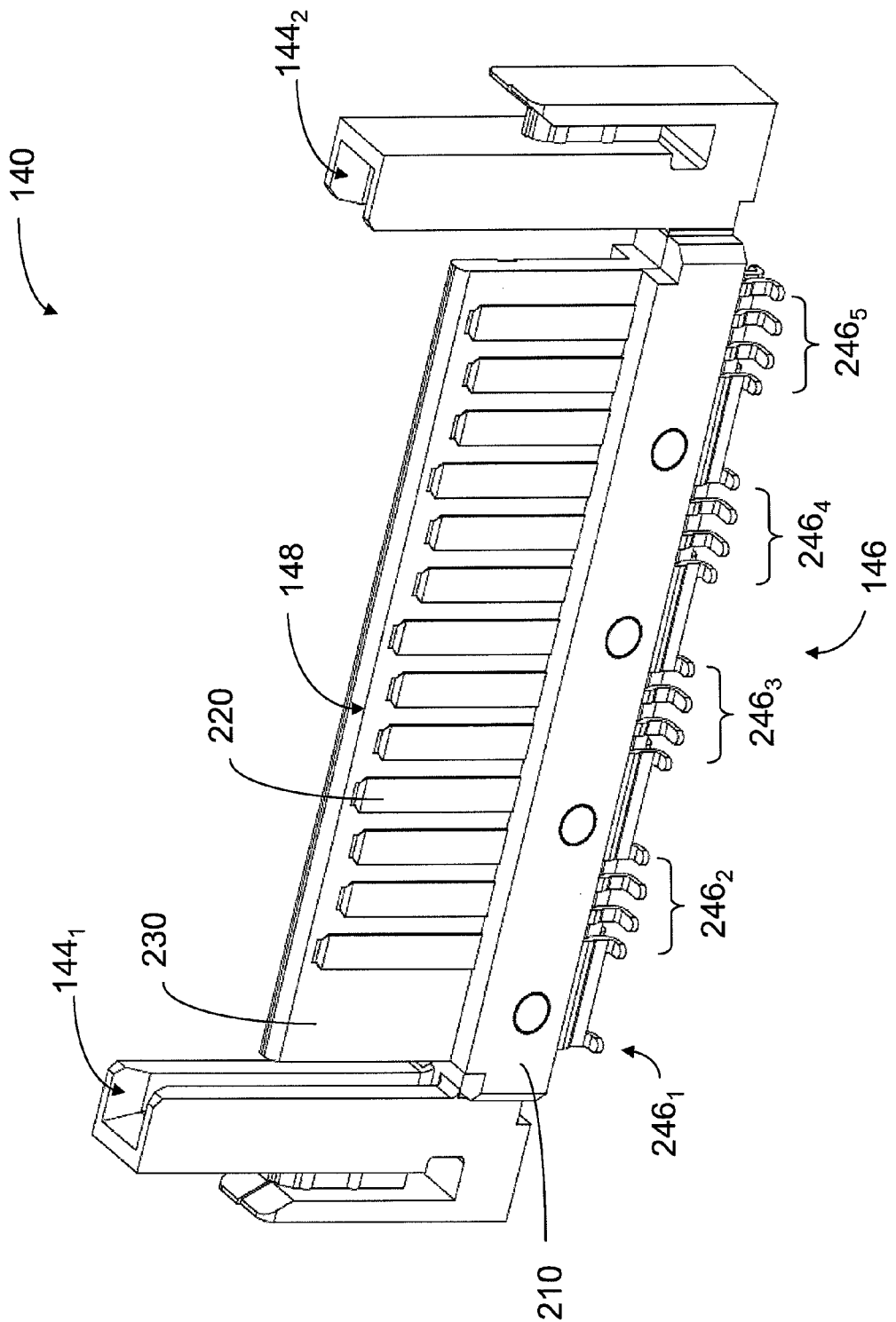
FIG. 3 is a perspective view of a backplane wafer subassembly according to some embodiments of the present invention.
Figure 4:
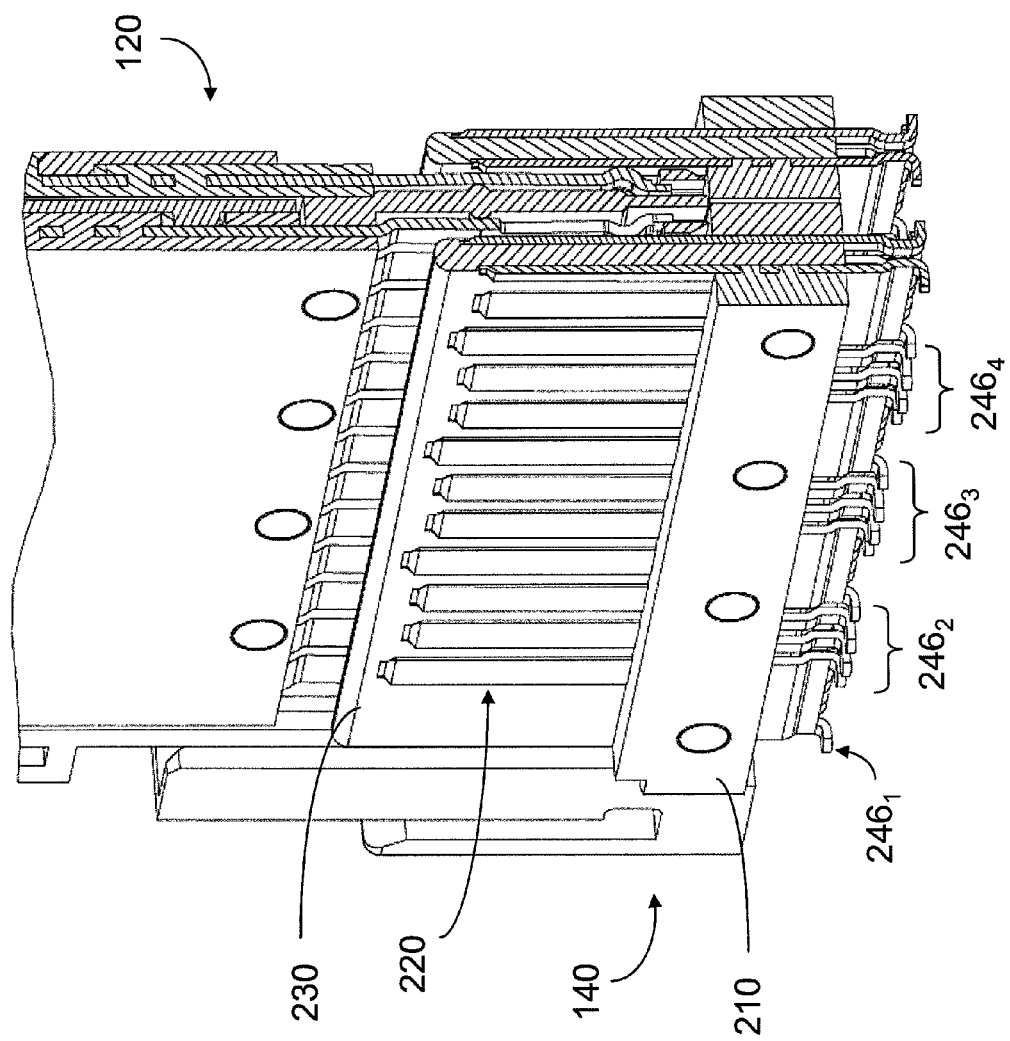
FIG. 4 is a perspective view, partially cut away, of a mating portion of a daughter card wafer subassembly.

Referring to FIGS. 3 and 4, backplane wafer subassembly 140 has a plurality of conductive elements shaped and positioned to provide an electrical connection between mating contacts 148 of wafer subassembly 120 and backplane 150. In the illustrated embodiment, backplane wafer subassembly 140 includes grooves $144_1$ and $144_2$ that engage with attachment features on either side of a daughter card front wafer housing of a wafer subassembly 120.

Conductive elements of backplane wafer subassembly 140 are positioned so that their mating contact portions align with the mating contact portions of the conductive elements in wafer subassembly 120. Accordingly, FIG. 3, in which one side of a backplane wafer subassembly is visible, shows conductive elements in backplane wafer subassembly 140 arranged in a parallel column, with a second parallel column on an opposing side (not visible in FIG. 3). In the embodiment illustrated, each of the parallel columns includes multiple signal conductors that are configured as differential pairs with adjacent ground conductors between each pair. In the embodiment illustrated, the mating contact portion of the ground conductors are longer than the mating contact portion of the signal conductors.

Each backplane wafer subassembly 140 includes two lead frames 220, each adapted to mate with one column of conductive elements from a daughter card connector. In the embodiment shown in FIG. 4, each of the lead frames 220 is the same, though oriented in opposite directions. Each lead frame 220 includes mating contact portions 148. In the embodiment illustrated, each mating contact portion is shaped as a blade or pad and positioned for a dual beam contact from a daughter card wafer subassembly 120 to press against when a daughter card and backplane connector are mated.

Each of the conductive elements in a backplane wafer subassembly also includes contact tails 146, which are grouped in contact tail groups $246_1$, . . . , $246_5$. With the exception of group $246_1$, which is positioned at the end of a column, in the illustrated embodiment each of the groups has four contact tails—two associated with a pair of signal conductors, and two on either side of the pair, associated with ground conductors.

Each ground conductor may have multiple contact tails extending from a planar portion. Here two contact tails are shown. Within backplane wafer subassembly 140, the wide planar portion from a ground conductor will align with ground contact tails in one of the groups $246_2$, . . . , $246_5$ in an adjacent column. As illustrated, the planar portion extends below the housing portions 210 and 230 and aligns with the pair of signal conductors in the group. Though, in embodiments in which components, such as capacitors are mounted within the connector footprint, such planar portions may be omitted to provide clearance for the capacitors.

In the embodiment illustrated, the conductive elements in a backplane wafer subassembly 140 extend in groups of four conductive elements similar to those in daughter card wafer subassembly 120. Accordingly, similar footprints may be used for mounting either a backplane connector or a daughter card connector. The footprint associated with a backplane connector, like a foot print for a daughter card connector, may have parallel columns of signal pads and ground pads. The ground pads may be shaped for attachment on contact tails from ground conductors in adjacent columns. As can be seen in FIG. 3, the contact tails in the columns of a backplane wafer subassembly 140 face outward towards an adjacent subassembly. As a result, the pattern of signal and ground contact tails existing within one daughter card wafer subassembly exists between two halves adjacent backplane wafer subassemblies. Thus, though the pattern of signal and ground pads in the footprints for the daughter card and backplane may be generally the same, that pattern is shifted in the backplane relative to the daughter card by an amount equal to one half a wafer subassembly.

FIG. 4 illustrates a section profile, for example, with contacts from a daughter card wafer subassembly 120 pressing against mating contact portions of adjacent backplane wafer subassemblies 140. FIG. 4 also illustrates the alignment of respective daughter card wafer subassemblies 120 and backplane wafer subassemblies 140. As shown, the mating surfaces of conductive members on each of the subassemblies face outwards. Also as illustrated, both of the subassemblies include mating contact portions on two opposing surfaces. With this configuration, the mating contact portions on each side of a daughter card wafer subassembly press against the mating contact portions of an adjacent backplane wafer subassembly. Consequently, each daughter card wafer subassembly 120 fits between and mates with two backplane wafer subassemblies.

Backplane 150 or daughter card 130 may include a footprint pattern, including mounting pads where contact tails from either the backplane wafer subassembly 140 or wafer subassembly 120, for example, may establish an electrical connection. In embodiments illustrated, electrical connection may be established through a surface mount reflow solder process. However, any suitable attachment mechanism may be used.

Mounting pads may be patterned in any suitable fashion, including known printed circuit board manufacturing techniques. Though, it is not a requirement that the footprint be formed on a surface of a printed circuit board, as any other suitable substrate may be used for attachment of a connector.

Figure 5:
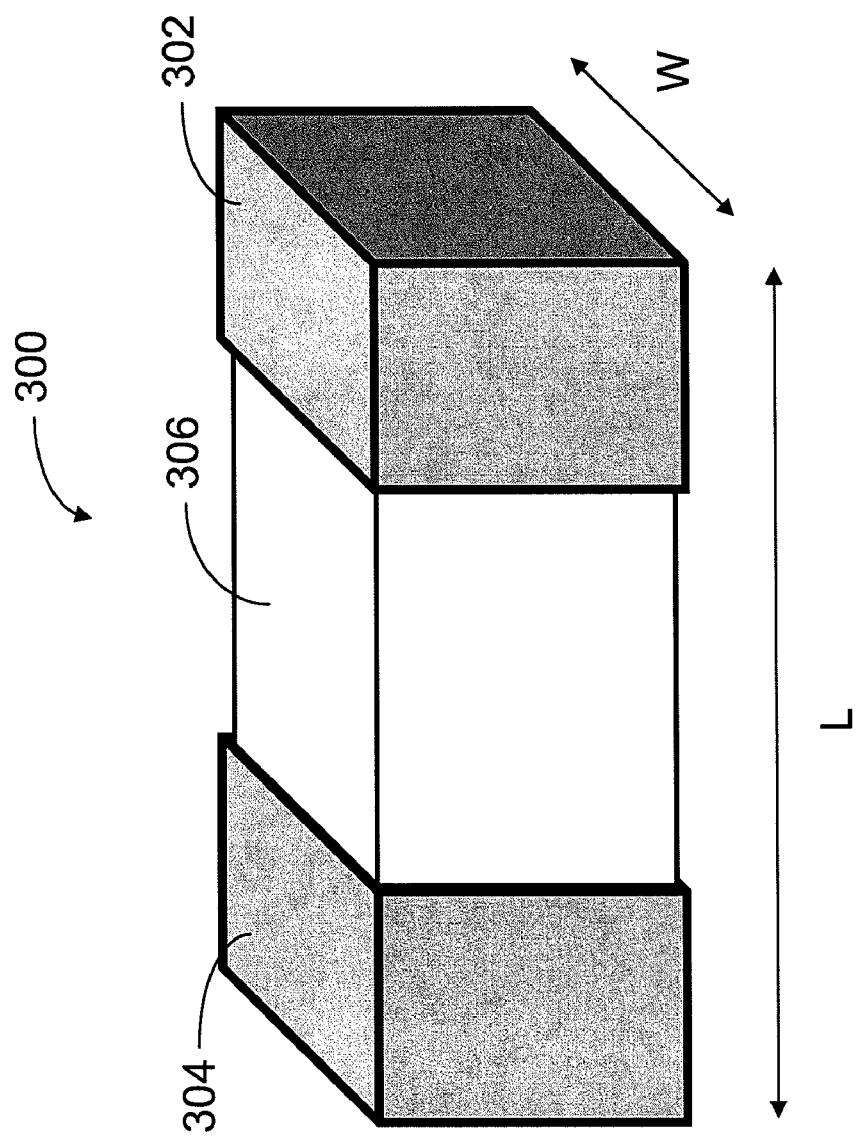
FIG. 5 is a perspective view of a surface mount capacitor.

As discussed previously, capacitors may be placed on a printed circuit board according to how the mounting pads are arranged on the footprint pattern. The capacitors may provide an electrical pathway between signal connectors and the board, for example, through conductive vias. The capacitors may be surface mount components as are known in the art. FIG. 5 depicts an illustrative embodiment of a capacitor 300 that may be appropriately coupled with a suitable contact region (e.g., mounting pad) on a printed circuit board. As depicted, the capacitor 300 includes two conductive regions 302 and 304 on opposing ends of a central region 306. These end caps 302 and 304 may be made from or coated with a conductive, solder-wettable material to facilitate soldering of the capacitor to a printed circuit board using solder. The capacitor 300 may have any size and a shape suitable for a surface mount component.

Manufacturing equipment for placing surface mount components on printed circuit boards is known in the art and commercially available. Likewise, equipment is also commercially available for dispensing solder paste onto a printed circuit board, into which ends of the capacitor 300 may be placed. Additionally, reflow ovens and other equipment for electrically connecting surface mount components to a printed circuit board are known in the art and commercially available. In some embodiments, the capacitor 300 may be placed and soldered as part of operations that would otherwise occur during manufacture of a printed circuit board using conventional surface mount technology.

Capacitor 300 may include any appropriate geometry and capacitive properties. For example, different capacitors may have conductive regions that have different widths w. Embodiments of capacitor components that may be appropriate for use in printed circuit boards as described include 01005 capacitors, 0201 capacitors, 0402 capacitors, 0603 capacitors, 0805 capacitors, 1206 capacitors, 1210 capacitors, 1808 capacitors, 1812 capacitors, 2220 capacitors, and/or any combination of capacitors that may be suitable for use on a printed circuit board.

Capacitors may be formed in any suitable shape or configuration. For example, capacitors may be shaped as a hexahedron or other polyhedron. In some embodiments, capacitors may be rectangular in cross-section. It can be appreciated that the size of capacitors used herein may be as appropriately determined.

Though capacitors or other components to be incorporated into a connector footprint may be specifically designed and manufactured to provide suitable electrical or mechanical properties, in some embodiments, capacitor 300 may be a commercially available surface mount component. Conventional surface mount components may be preferred as such components may be readily available and inexpensive to use in a manufacturing process. Conventional printed circuit board design tools may also be used for specifying the parameters of manufacture and construction of a printed circuit board to receive appropriately chosen components. Additionally, conventional components may be packaged for handling by conventional surface mount equipment, providing for conventional assembly tools and processes to be used in making printed circuit boards that contain capacitors.

When mounted to a printed circuit board, each conductive region 302 and 304 may be attached to a pad on the surface of the printed circuit board. As discussed previously, a conductive via may be used to couple a pad on a printed circuit board to either a signal trace or ground plane within the printed circuit board. Such vias may be formed using printed circuit board manufacturing techniques known in the art, such as by drilling a hole and plating the hole with conductive material. However, any suitable mechanism may be used to form a connection between a pad and conductive element within the printed circuit board.

Figure 6:
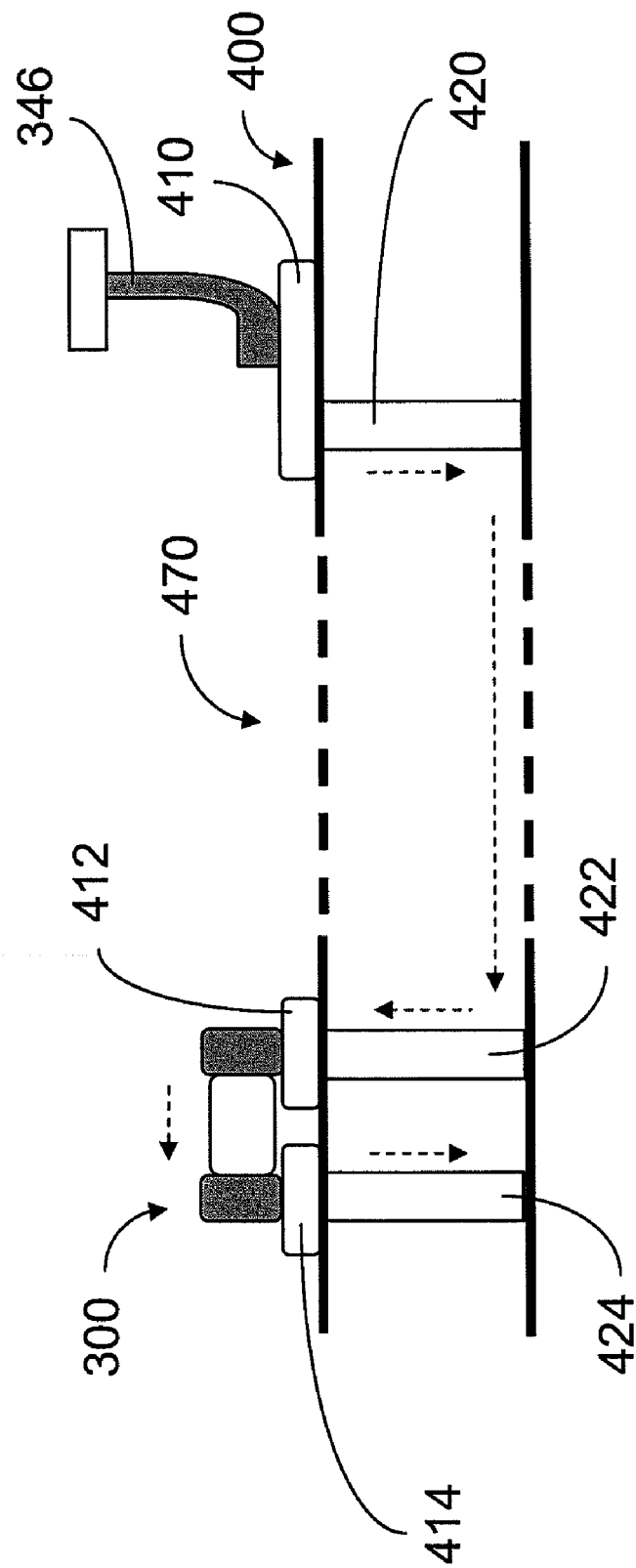
FIG. 6 is a cross-section view of a contact tail and a capacitor mounted on a footprint including three conductive vias according to some embodiments of the present invention.

However, unlike a conventional mounting arrangement, capacitor 300 may be mounted to two pads, only one of which contains a via. FIG. 6 depicts a conventional mounting pad arrangement in which a contact tail 346 of a signal conductor from an electrical connector is placed on a signal conductor mounting pad 410 of a footprint 400. Capacitor 300 is placed on signal conductor mounting pads 412 and 414. Conductive vias 420, 422, and 424 are in direct electrical contact with signal conductor mounting pads 410, 412, and 414, respectively. Once contact tail 346 and capacitor 300 are appropriately placed on the signal conductor mounting pads, as shown, an electrical pathway is established. The electrical pathway runs through three separate conductive vias, 420, 422 and 424, electrically associating the contact tail 346 with the capacitor 300. As illustrated by the dotted arrows, for example, current flows through contact tail 346 through mounting pad 410; down conductive via 420; up conductive via 422; through mounting pad 412, capacitor 300, and mounting pad 414; and down conductive via 424. Current may flow from conductive via 420 to conductive via 422 through any appropriate conducting line, such as a signal trace within a PCB, for example.

Figure 7:
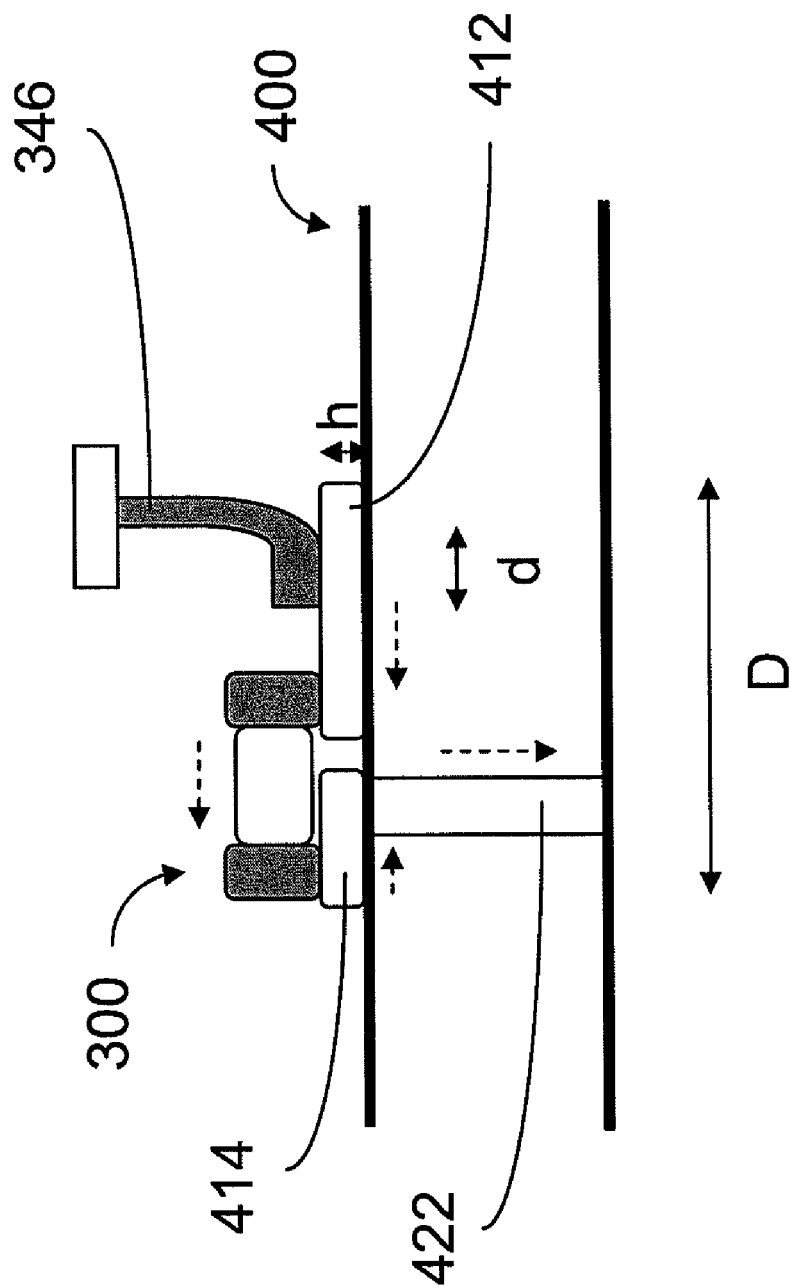
FIG. 7 is a cross-section view of a contact tail and a capacitor mounted on a footprint including only one conductive via.

FIG. 7 shows an illustrative embodiment that provides for an electrical connection similar to that depicted by FIG. 6 while utilizing only a single conductive via.

A mounting pad arrangement is provided where a contact tail 346 of a signal conductor from a connector is placed on a signal conductor mounting pad 412 of a footprint 400. Capacitor 300 is placed on signal conductor mounting pads 412 and 414. Conductive via 422 is in direct electrical contact with signal conductor mounting pad 414. Once contact tail 346 and capacitor 300 are appropriately placed on the signal conductor mounting pads, as shown, an electrical pathway is established. The electrical pathway runs through a single conductive via, providing an electrical connection between contact tail 346 and capacitor 300. The dotted arrows illustrate, for example, current flowing through contact tail 346 through mounting pad 412, capacitor 300, and mounting pad 414; and down conductive via 422. The embodiment in FIG. 7 illustrates how a similar electrical connection may occur as in the embodiment of FIG. 6, but while using fewer components, such as vias, in the electrical path.

Figure 8A:
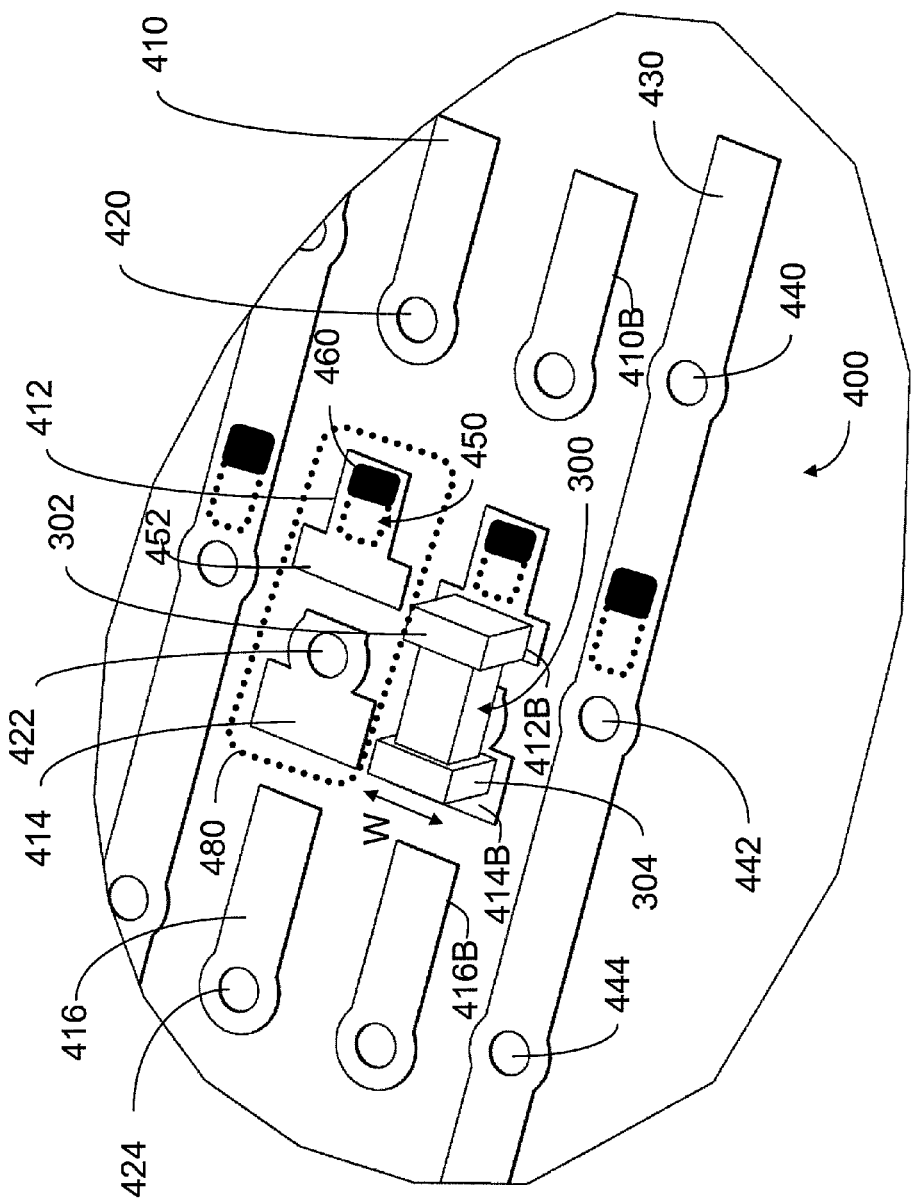
FIG. 8A is a close perspective view of a capacitor mounted on to a backplane footprint according to some embodiments of the present invention.
Figure 8B:
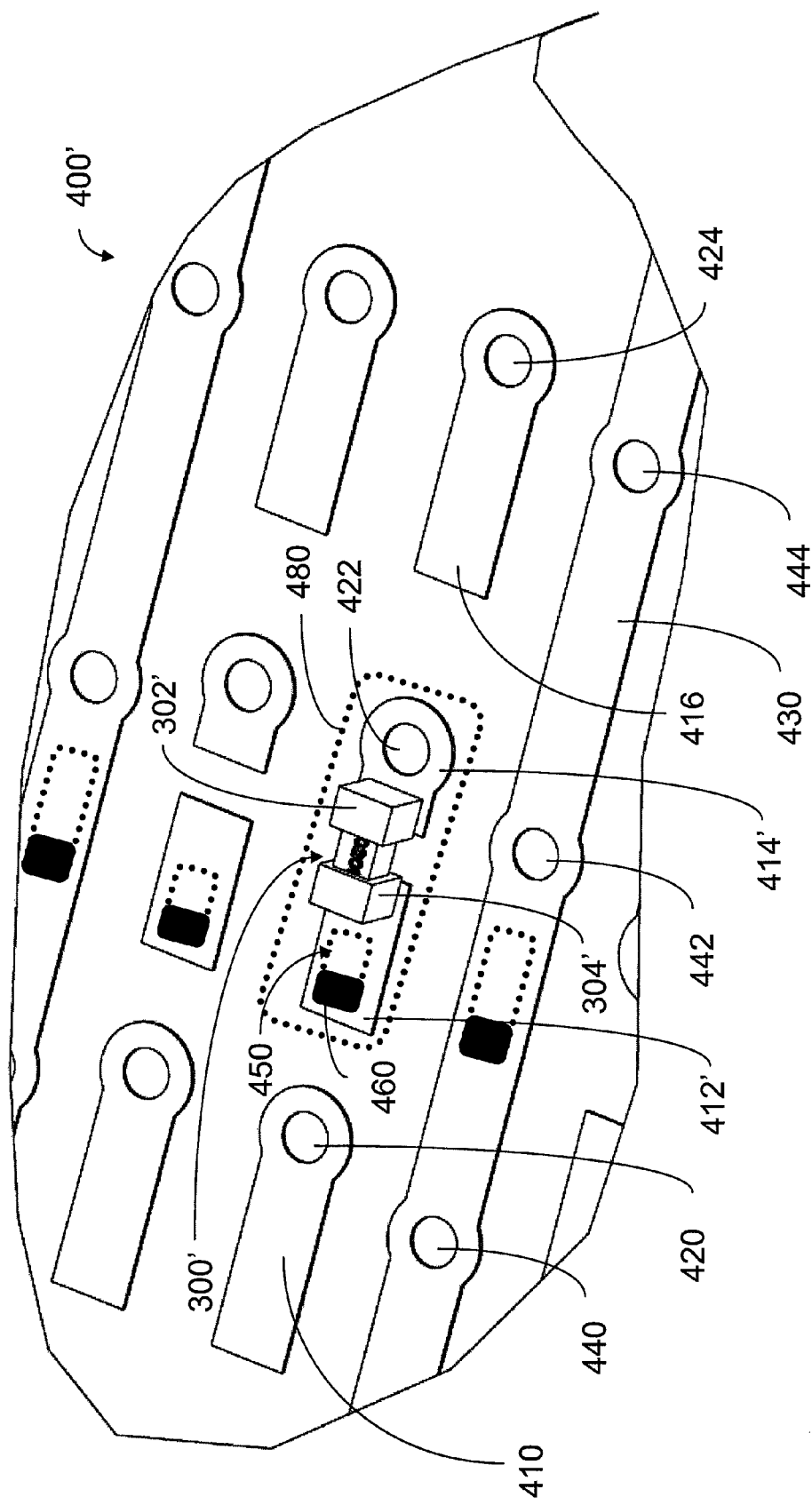
FIG. 8B is a close perspective view of a capacitor mounted on to an alternative embodiment of a backplane footprint.
Figure 8C:
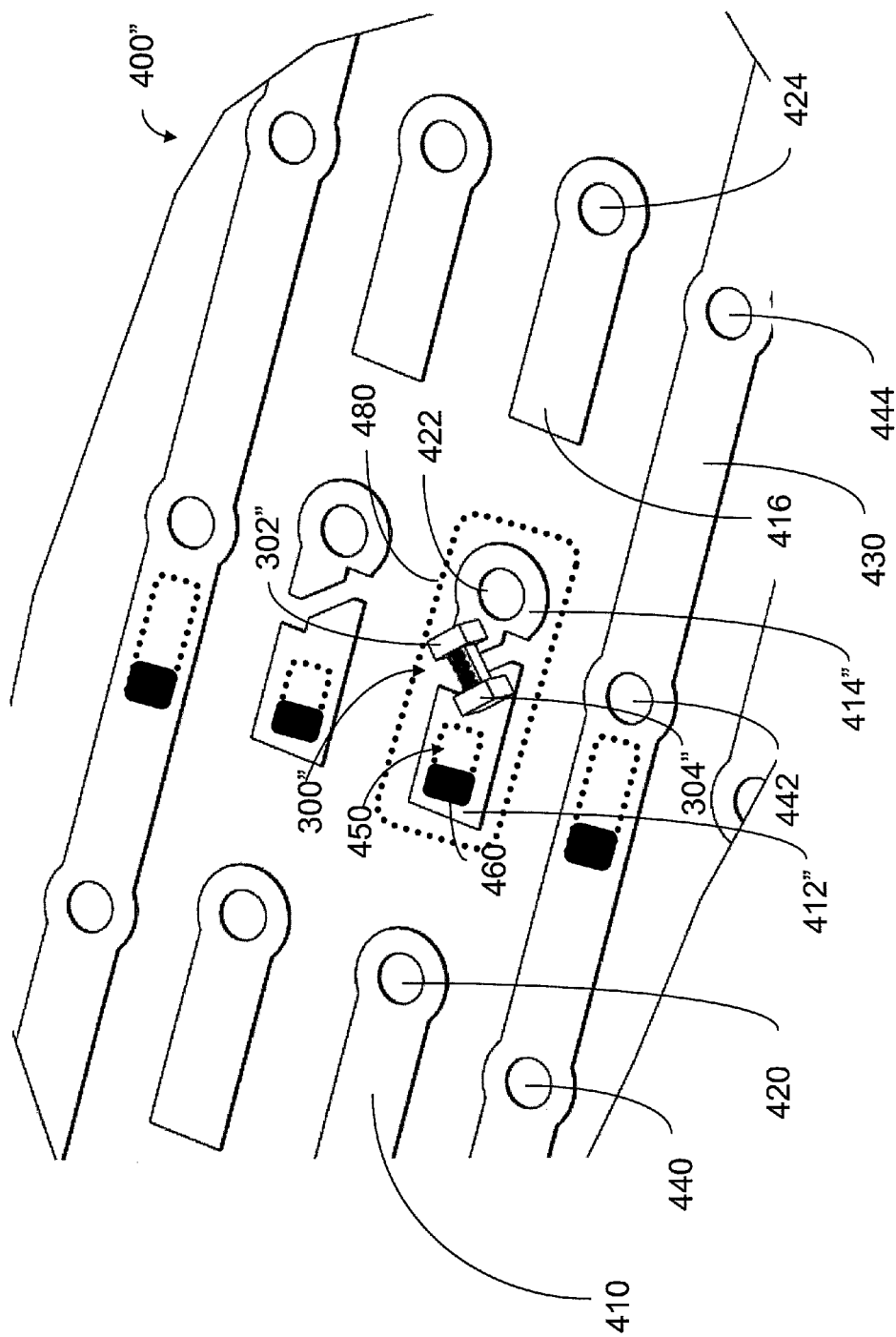
FIG. 8C is yet another close perspective view of a capacitor mounted on to a backplane footprint according to an alternative embodiment of a backplane footprint.

FIGS. 8A-8C depict various embodiments of mounting pads of a connector footprint on a printed circuit board configured for placement of capacitors. Mounting pads may be designed to accommodate different sizes and shapes of capacitors for establishing desired electrical connections.

FIG. 8A shows one embodiment of mounting pads of a footprint that are suitably shaped for placement of a capacitor 300 having conductive regions 302 and 304 that are larger in width w than a corresponding width of a respective signal connector contact tail (not shown). Elements having reference number labels are provided by way of example as not every element in the figure is labeled with a reference number.

Mounting pads for signal conductors may be disposed in pairs along a column with ground pads, such as ground pads 430, between adjacent pairs in a column. Each column of pads may be aligned with a column of contact tails in a wafer subassembly. For simplicity, FIG. 8A shows only a portion of a footprint, here mounting pads associated with contact tails of three wafer subassemblies. Specifically, mounting pads for a pair of signal conductors in each column with adjacent ground pads are shown. The pattern of pads illustrated in FIG. 8A may be repeated, creating more columns or longer columns to accommodate a connector of any size.

The footprint pattern 400 includes signal conductor mounting pads 410, 412, 414, and 416. Signal conductor mounting pad 410 is positioned in a pair with pad 410B. Signal conductor mounting pad 412 is positioned in a pair with pad 412B. Signal conductor mounting pad 414 is positioned in a pair with pad 414B, and Signal conductor mounting pad 416 is positioned in a pair with pad 416B. In the embodiment illustrated, signal conductor mounting pads 412 and 414 are configured to receive a capacitor between them. Likewise, mounting pads 412B and 414B are configured to receive a capacitor between them. Though, pads 410, 410B, 416, and 416B are not. However, it should be recognized the number and placement of pads configured to receive capacitors is not a limitation of the invention. Some or all of the signal conductor mounting pads in a connector may be configured to receive a capacitor.

Mounting pads 412 and 414 are shaped to receive a suitably sized capacitor 300 having conductive regions 302 and 304, respectively. FIG. 8A also shows mounting pad 412 having a contact region 450 for receiving an appropriate signal connector contact tail, which may be soldered to pad 412 oriented to form a solder fillet in region 460. A region 452 is provided to receive an end of a capacitor, such as capacitor 300. In this embodiment, region 452 is wider than contact region 450 and may accommodate a capacitor that is wider than a contact tail. Regardless of the size of the capacitor, once the capacitor 300 is suitably mounted, an electrical connection is established between pads 412 and 414. FIG. 8A illustrates a capacitor 300 placed on pads 412B and 414B, which in the embodiment illustrated have the same shape as pads 412 and 414, respectively.

Some of the signal conductor mounting pads are electrically connected to conductive elements within the printed circuit board through vias passing through the signal mounting pads. Ground mounting pads are similarly connected to conductive ground elements within the printed circuit boards through ground vias.

Ground conductive mounting pad 430 is also shown, disposed alongside and parallel to the signal conductor mounting pads. Ground conductive mounting pad 430, in the embodiment illustrated, is an elongated stripe, running perpendicular to the column direction of the footprint. As shown, signal pads may be paired in between ground pad strips. The pads may be regarded as being paired in two respects. First, pads are paired for receiving contact tails of differential signal conductors. For example pads 410 and 410B are paired along a column for receiving contact tails from a pair of signal conductors. Likewise 412 and 412B, 414 and 414B and 416 and 416B are paired such that each pad in a pair can receive a contact tail from a signal conductor that is one leg of a differential pair. However, the invention is not limited to embodiments in which signal conductors are mounted in pairs for receiving differential signal pairs.

Second, pads adapted for mounting of capacitors are paired. Pads 412 and 414 are paired for mounting a capacitor, as are pads 412B and 414. These pairs contain a shared pad, which does not contain a via connecting the pad to a signal trace within the printed circuit board, and a second pad with a via connected to a signal trace. These pads are shaped and positioned with a space between the pads that can be bridged by a capacitor, or other component, attached to the pads.

As illustrated, only two pairs of pads for mounting a capacitor are illustrated, pads 412 and 414 and pads 412B and 414. Moreover, these pairs are shown associated with pads for two legs of the same differential signal. Though including a capacitor on each leg of a differential signal may provide balanced electrical properties between the legs of the differential pair, it is not a requirement that both legs of differential pair incorporate a component or the same component. For example, it may be desirable to attach components with different electrical characteristics to legs of the same pair to compensate for skew. Accordingly, the number an placement of pads adapted for receiving capacitors shown in FIG. 8A exemplifies the types of pads that may be present. Those pads may be arranged differently than shown.

Conductive vias are also depicted in FIG. 8A. Ground conductive vias 440, 442, and 444 are depicted along the path of ground conductor mounting pad 430. Signal conductive vias 420, 422, and 424 are shown on one end of signal conductor mounting pads 410, 414, and 416, respectively.

For pads 412 and 414, there are two separated pads for one signal contact tail. Only one such pad, here pad 414 contains a via. The other pad, pad 412, is shared by a contact tail and an end of a capacitor, but does not contain a via. In this way, an electrical connection between the contact tail on pad 412 and a signal trace within the PCB is through a capacitor mounted between pads 412 and 414, as is illustrated by capacitor 300 between pads 412B and 414B.

FIG. 8B shows an embodiment of mounting pads for mounting a capacitor in a footprint. In this embodiment, the pads are suitably shaped for placement of a capacitor 300 that is smaller than the capacitor shown in FIG. 8A, or at least that is narrower than or comparable in width to the contact tails. Footprint pattern 400 includes signal conductor mounting pads 410, 412', 414', and 416. Mounting pads 412' and 414' are suitably shaped to receive conductive regions 302' and 304', respectively, of an appropriate size capacitor 300'. Mounting pad 412' is a shared pared. Accordingly, FIG. 8B depicts mounting pad 412' having a contact region 450 for receiving a signal contact tail. When capacitor 300' is suitably mounted, an electrical connection is established between pads 412' and 414'. Unlike the embodiment of FIG. 8A, no special widened region is provided for mounting an end of the capacitor.

Though, as in FIG. 8A, ground conductive mounting pads 430 are disposed alongside and parallel to the signal conductor mounting pads. In addition, signal conductors are paired in between ground conductors. Conductive vias are also depicted in FIG. 8B with ground conductive vias 440, 442, and 444 provided along the path of ground conductor mounting pad 430. Signal conductive vias 420, 422, and 424 are shown on one end of signal conductor mounting pads 410, 414', and 416, respectively, but no via is provided in the shared pad 412'.

FIG. 8C shows yet another embodiment of mounting pads that are suitably shaped for placement of an even smaller capacitor 300 than the capacitor shown in FIGS. 8A and 8B, which in this embodiment are also narrower than the contact tails being mounted to the pads shown. As shown in FIG. 8C, mounting pads 412" and 414" are shaped to receive conductive regions 302" and 304" with capacitor 300" placed in an angled fashion with respect to the columns of the footprint. It can be appreciated that mounting pads may be shaped in any suitable manner so as to provide a conductive mounting region for capacitor end caps, such as 302" and 304", or other terminals. Once the capacitor 300" is suitably mounted, an electrical connection is established between pads 412" and 414" through conductive regions 302" and 304".

In addition to ground conductive mounting pads 430 being disposed alongside and parallel to the signal conductor mounting pads, signal conductors are paired in between ground conductors. Conductive vias are also shown with ground conductive vias 440, 442, and 444 provided along the path of ground conductor mounting pad 430. In addition, signal conductive vias 420, 422, and 424 are illustrated on one end of signal conductor mounting pads 410, 414, and 416, respectively.

As discussed above, the pads of footprint 400 may be made with any suitable dimensions. As one example, each signal pad, such as pad 412 may have an area for receiving a contact tail that is substantially rectangular with a width on the order of 0.35 mm and a length of about 0.85 mm. A via, such as via 422 may be surrounded by a portion of a pad such as pad 414, the via 422 having a diameter on the order of 0.5 mm. A ground via, such as ground via 440 may have dimensions that are on the same order as a signal via or less than the dimensions of a signal via, such as 0.5 mm or less. It can be appreciated that vias, pad areas or any other features presented herein may include any suitable dimension.

Contact regions 450 are schematically depicted to show where contact tails may connect to pads of footprint 400, 400' or 400". As described previously, for example, contact tails may be soldered to pads in an appropriate footprint pattern. Because contact tails typically exhibit a curved feature adjacent to the flat portion of the tail, an accumulation of solder, or solder heel, may occur in proximity to the curved feature. In this regard, solder heels 460, shown in FIGS. 8A-8C, are depicted as the black areas of the contact regions on the footprint. Accordingly, the flat portions of the contact tails that come into electrical communication with the footprint are given by an approximate area bounded by the dotted outline. As can be seen in FIGS. 8A-8C, the contact tails are oriented on the pads of footprint 400, 400' or 400" so that the distal portion of each contact tail is adjacent the location at which an end of a capacitor is attached to a shared pad. The solder heel is positioned at an opposite end of the signal pads. It can be appreciated that solder heels 460 are not limited to the confines of the region in which they are depicted as any suitable amount of solder may be added as appropriately desired. For example, a larger amount of solder may be added to the more flat portion of the contact tails in comparison to the curved portion of the contact tails. In addition, contact regions may be shorter, larger, wider, and/or narrower depending on the dimensions of the contact tails that connect to each respective mounting pad.

Nonetheless, the configuration illustrated may be desirable for high frequency signals because it reduces abrupt changes in direction of current flow through the signal conductors. Abrupt changes in a conducting structure can be undesirable because they can introduce signal reflections, which reduce signal integrity. As shown, a signal propagating from a contact tail will transition to a surface mount pad associated with that tail. The signal can generally without abrupt discontinuities into one end of the capacitor. The signal may continue to propagate into a pad associated with the second end of the capacitor, again traveling in the same general direction. The signal may then transition into the via of that pad, where to may ultimately couple to a signal trace within the printed circuit board on which the connector is mounted. Accordingly, other than the transition associated with the via, abrupt discontinuities are avoided.

A similar mounting arrangement is also used for ground conductors. Abrupt changes in the direction of current flow in a ground path can also result in undesirable effects on electrical properties, such as a non-uniform inductance.

In some embodiments, connectors including surface mount contact tails are attached using a reflow solder process. In a reflow process, solder paste in deposited on pads of a footprint, such as footprint 400. The connector is placed on the printed circuit board, with contact tails in the solder paste. The printed circuit board, including the solder paste and the connector, are then heated to a sufficiently high temperature to cause the solder paste to melt. When the board is allowed to cool, the solder fuses the contact tails to the pads.

Figure 9A:
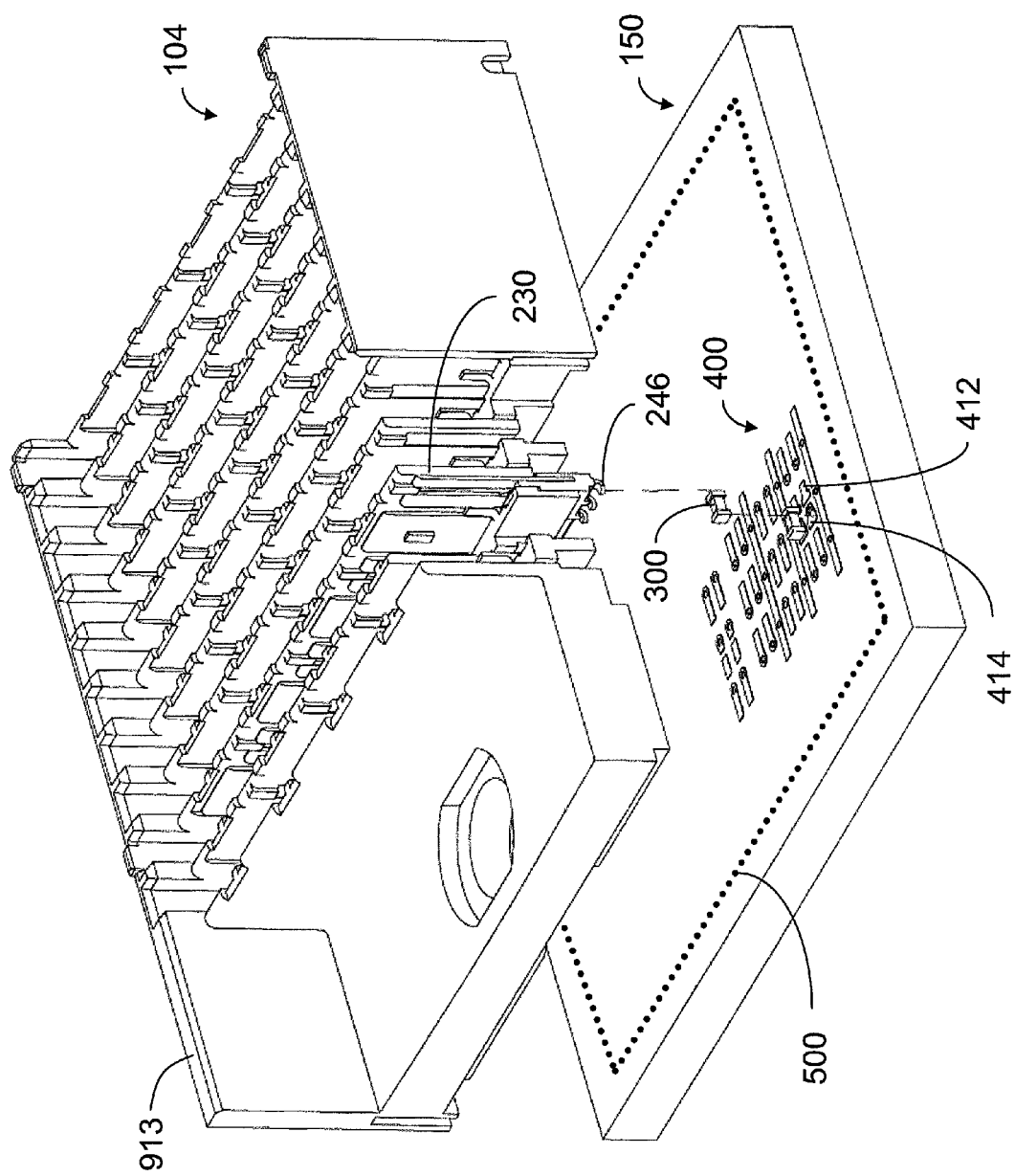
FIG. 9A is a partially exploded view of a backplane wafer subassembly with several connectors and capacitors in alignment with a backplane footprint according to some embodiments of the present invention.
Figure 9B:
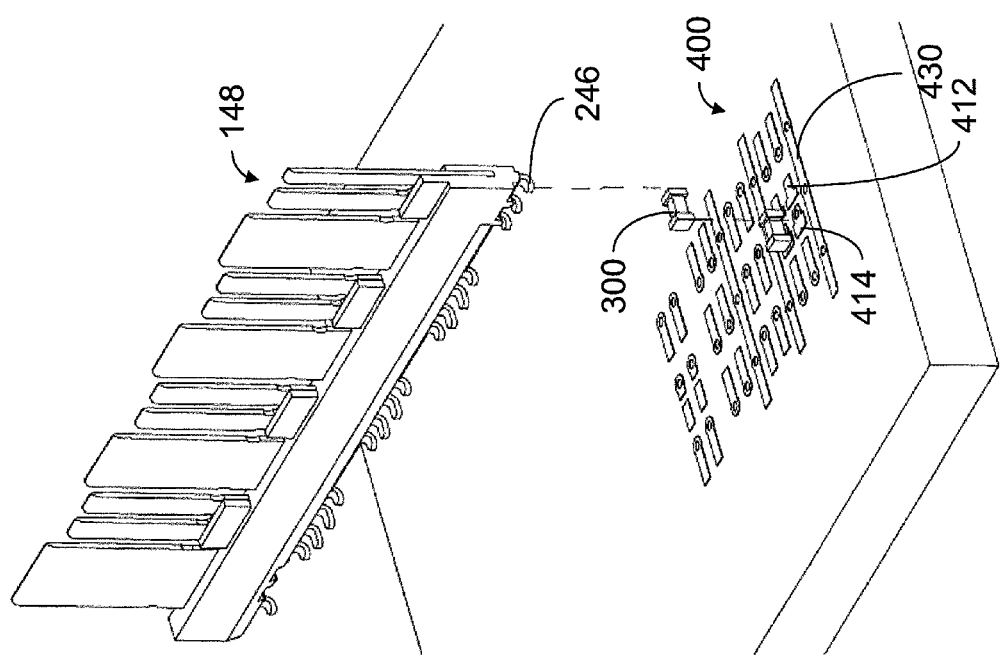
FIG. 9B is a partially exploded view of a portion of the embodiment in FIG. 9A showing mating contacts of a wafer subassembly of a backplane connector and capacitors in alignment with a backplane footprint.

Capacitors may be incorporated into connector footprints on any suitable PCB, including either daughter boards or backplanes. FIG. 9A illustrates an embodiment in which capacitors are mounted on the backplane. FIG. 9A illustrates a portion of a backplane connector that is partially cut away to reveal a backplane wafer subassembly 140 that is in alignment with a footprint 400 on backplane 150 for connection of contact tails of the backplane wafer subassembly. As shown, a wafer includes a housing portion 230 and a contact tail 246 that is suitably aligned for placement of the contact tail on signal conductor mounting pad 412. Capacitor 300 is also aligned for placement of the capacitor on signal conductor mounting pad 414. FIG. 9B illustrates the embodiment shown in FIG. 9A except showing the mating contacts 148 and contact tails 246 without the rest of the backplane wafer subassembly 140.

FIGS. 9A and 9B may be regarded as illustrating a printed circuit board during a phase in a process of manufacturing the board. In one embodiment of the process for mounting capacitors and connectors with contact tails on the board, capacitors are first placed on the printed circuit board, appropriately aligned with corresponding mounting pads on the board. Contact tails of connectors are then appropriately placed, aligned with corresponding mounting pads on the board. The components placed on the board may then be connected to the mounting pads, such as through a reflow soldering process.

Though, it is not necessary that the capacitors be placed separately from the connectors. Connector housings may contain recesses, clips or other features that allow the capacitors to be integrated with the connector housings before being placed on a printed circuit board. Though, even in embodiments in which the capacitors are not attached to the connectors before components are placed on the printed circuit board, the housing of the connector may be shaped to provide clearance and may alternatively or additionally be shaped to provide final alignment or positioning for capacitors placed in the connector footprint.

FIG. 9A also illustrates variations in the types of support structures that may be used to hold wafers. In this embodiment, rather than being attached to a stiffener as illustrated in FIG. 1, wafers are held in a housing module 913. Such a module or any other suitable support structure may be used instead of or in addition to stiffeners.

Figure 10A:
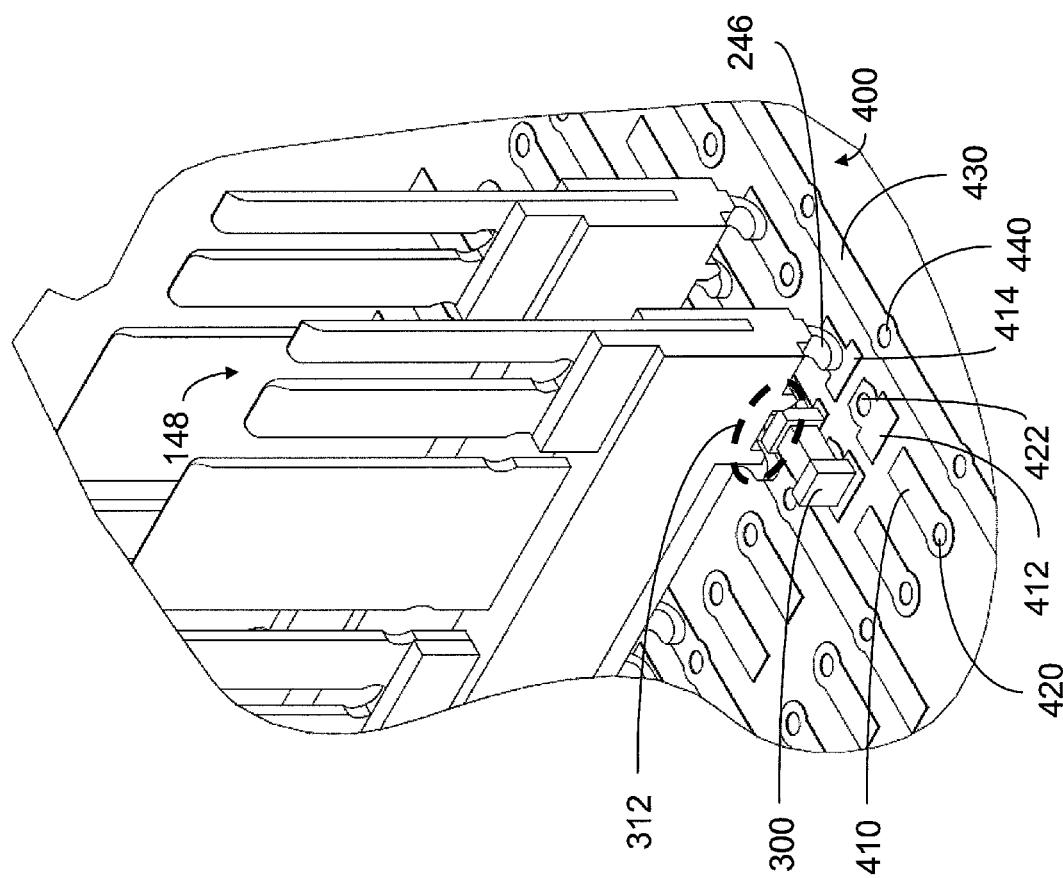
FIG. 10A is a close perspective view of a portion of an interconnection system including mating contacts and a capacitor mounted to the backplane footprint.
Figure 10B:
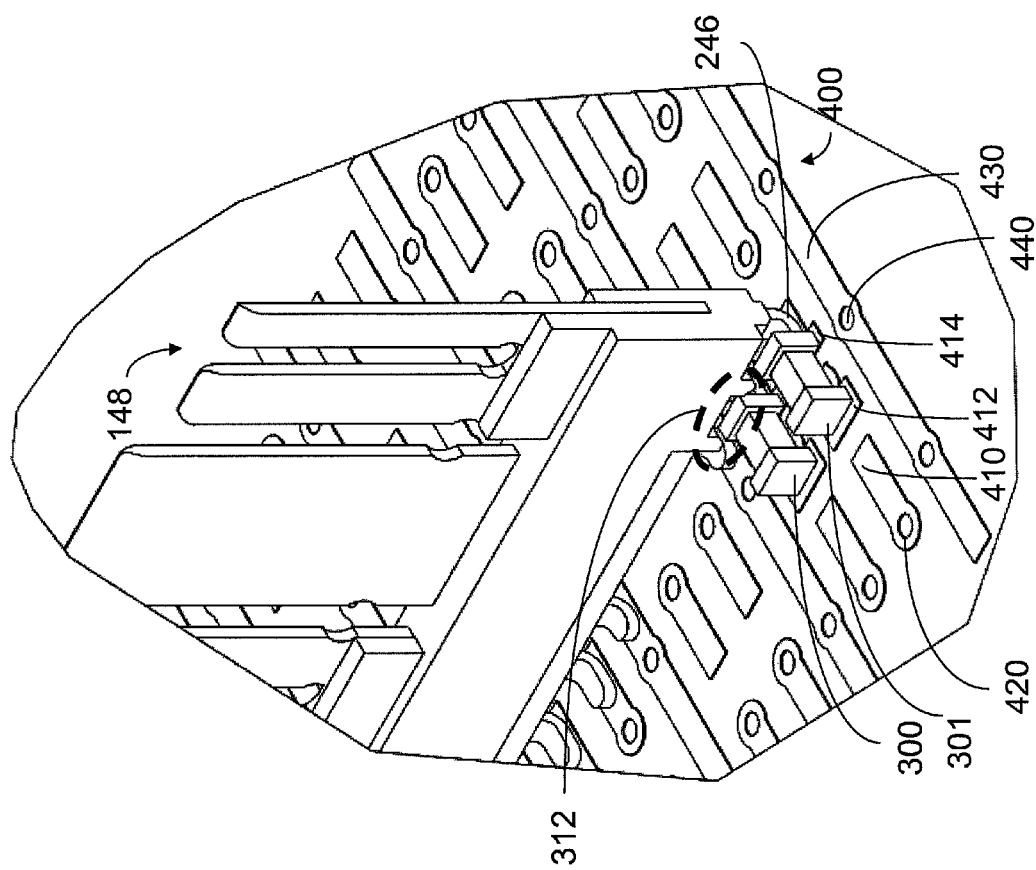
FIG. 10B is a close perspective view of a portion of an interconnection system including mating contacts and two capacitors mounted to the backplane footprint according to some embodiments of the present invention.
Figure 10C:
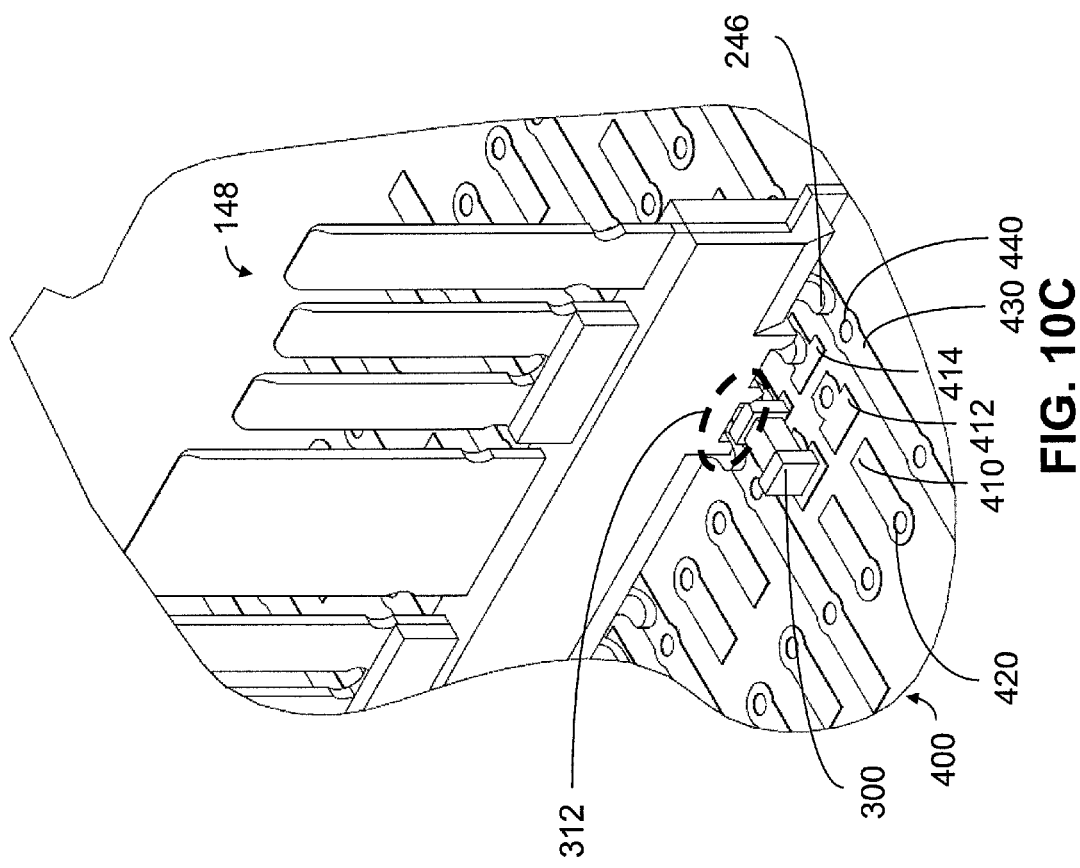
FIG. 10C is a close perspective view of mating contacts and a capacitor mounted to the backplane footprint in another configuration.

FIGS. 10A-10C illustrate embodiments of capacitors and contact tails that are connected to appropriate mounting pads. For example, FIG. 10A shows a capacitor 300 that is connected to mounting pads on the footprint 400 along with contact tails of mating contacts 148. Contact tail 246 is depicted to be mounted on to pad 414. As shown, the housing of the wafer subassembly has a recess 312 that provides a clearance for capacitor 300. For simplicity, no capacitor is shown mounted on to pads 412 and 414. However, as can be seen the housing of the wafer subassembly is shaped to provide clearance for a capacitor when one is placed on pads 412 and 414. Also, FIG. 10A shows the wafer subassembly partially cut away, with the portion of the wafer subassembly extending over ground mounting pad 430 cut away to reveal the mounting for capacitor 300.

FIG. 10B illustrates a capacitor mounted on pads 412 and 414. Contact tail 246 is mounted on to pad 414 in addition to a capacitor 301, establishing an electrical connection between mounting pads 412 and 414. As a result, with the mounting of contact tail 246 on pad 414 and the capacitor 301 on pads 412 and 414, an electrical connection is established through capacitor 301 between the connector of contact tail 246 and a via 422 (FIG. 10A) associated with mounting pad 412. As illustrated, a capacitor, 300 and 301, may be mounted for each leg of a differential pair.

FIG. 10C shows a wafer assembly with the end of a column of mating contacts 148 shown without a cutaway portion. In this view, a contact tail 246 (now associated with a ground mating contact, longer than an adjacent signal mating contact) is placed in electrical connection with ground conductive mounting pad 430. Though, capacitor 301 (FIG. 10B) is not shown in the view. However, a recess within the housing of the wafer subassembly for providing clearance for capacitor 301 is shown.

In the embodiment of FIGS. 10A . . . 10C, recesses are provided in the housing to provide clearance for capacitors placed on the board. In another embodiment of the process for mounting capacitors within a connector footprint, capacitors may be attached to a housing portion 240 of the wafers prior to placing the connector on the printed circuit board. In some embodiments, recesses within the connector housing may be shaped to receive the capacitors when they are attached to the connector. More generally, the connector housing may be shaped to receive a capacitor so that one end of the capacitor is adjacent to a contact tail with which the capacitor is to share a pad.

Figure 11:
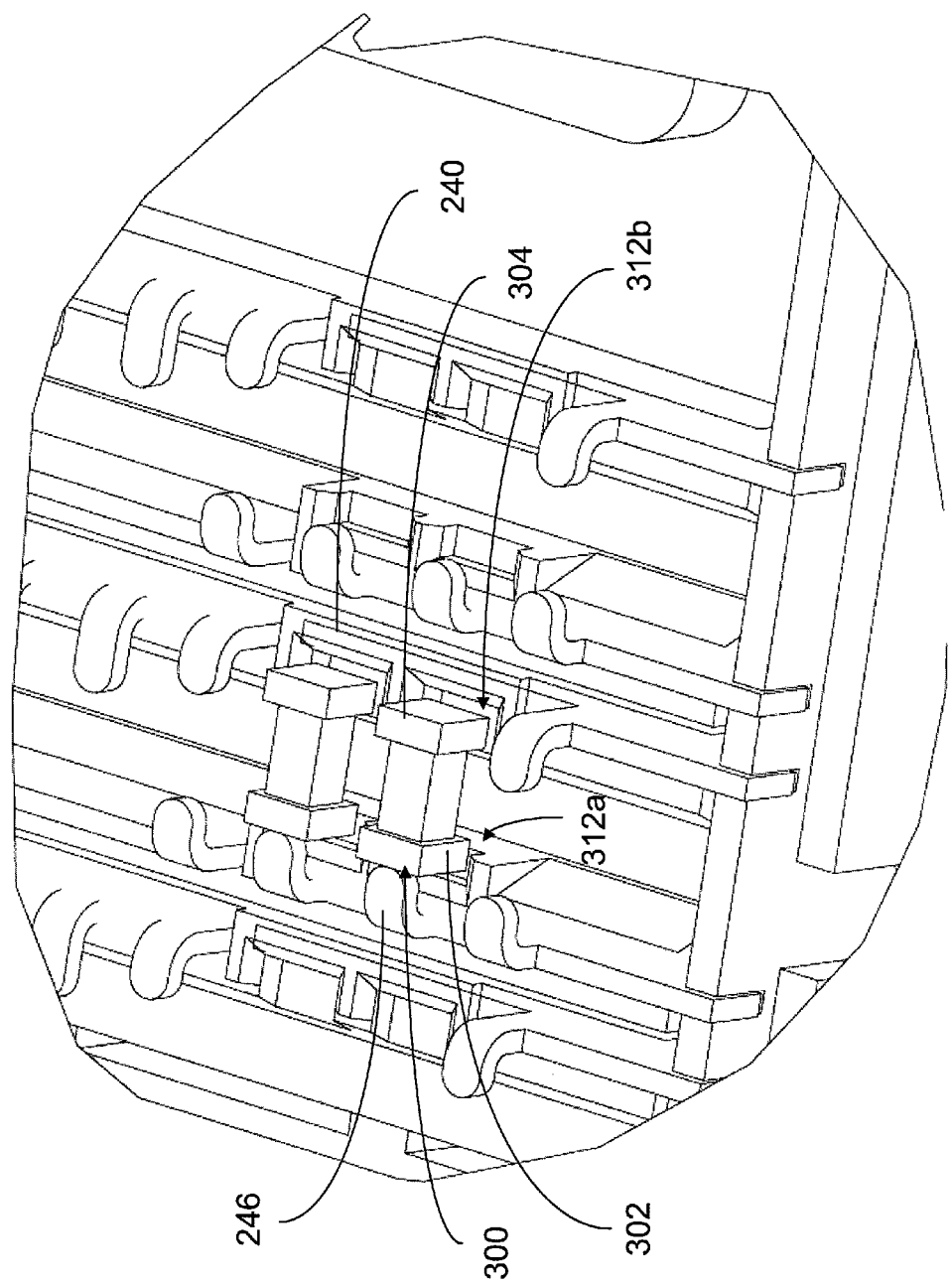
FIG. 11 is a close perspective view of capacitors disposed in recesses of a backplane connector housing.

As illustrated in FIG. 11, an end of capacitor 300 is placed in a region adjacent and aligned with contact tail 246. The region where the capacitor is placed includes recess 312a, corresponding to a regions where conductive portion 302 of the capacitor may be placed. A region 312b is also provided for conductive end portion 304. That region is also shaped as a recess in a housing of an adjacent wafer subassembly. Though, because end portion 304 is not intended to share a mounting pad with a contact tail of the connector, it is not aligned with a contact tail as is recess 312a. With this configuration, a portion of the capacitor 300 is disposed within the space between wafer subassemblies, providing a further mechanism for providing clearance for capacitors when placed in the connector footprint.

The capacitor may be attached to the housing through an appropriate adhering technique, for example, a glue dot or a weld. In some cases, other suitable techniques for holding the capacitor in place to the housing can be used, such as manufacturing the recesses to a size such that an interference fit is established between the capacitor and the housing. Alternatively, the housing may be manufactured with a projection or other feature, which may be molded as part of the insulative housing or inserted as a separate member, that can act as a clip or latch to hold the capacitor to the housing. In some embodiments, the method of adhesion, such as glue, is non-conductive and serves to hold capacitors in a suitable position in the housing so that all of the various capacitors and contact tails may be placed on the printed circuit board together. As a result, the capacitor is placed in the same location and provides the same electrical connection as provided in the process described earlier (where capacitors are placed on to mounting pads of the printed circuit board prior to contact tails being connected to their respective pads), the primary difference being that the capacitor is placed into the connector housing first so that both the contact tail and capacitor may be soldered to the printed circuit board simultaneously.

Configuring electronic components, such as capacitors, in a connector footprint using some or all of the techniques described above may provide one or more advantages. For example, improved performance of an electronic system may result. Avoiding vias as illustrated in FIG. 6 may provide a 3 dB improvement in signal strength. Another advantage that may be achieved in some embodiments is that costs of PCBs may be reduced. The size of the boards may be reduced or manufacturing costs may be reduced through a reduction in the number of vias that require back drilling. Moreover, design of PCBs may be simplified by reducing the number of vias in the vicinity of ASICs or other large chips that require blocking capacitors. Redesign of PCBs to implement Engineering Change Orders (ECOs) may also be simplified. These and other advantages may be achieved.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," "having," "containing," or "involving," and variations thereof herein, is meant to encompass the items listed thereafter and equivalents thereof as well as additional items.

Having thus described several aspects of at least one embodiment of this invention, it is to be appreciated various alterations, modifications, and improvements will readily occur to those skilled in the art.

As one example, incorporation of capacitors into the footprint of an electrical connector was described. Techniques as described herein may be used to alternatively or additionally incorporate other kinds of electronic components, such as resistors, into the footprint of an electrical connector.

Also, FIG. 7 illustrates a printed circuit board construction technique in which a capacitor is placed over a via 422. This configuration is not critical to the invention and other construction techniques may be employed. Techniques in which the via is not covered by capacitor may also be employed.

As another example, a connector designed to carry differential signals was used to illustrate selective placement of material to achieve a desired level of delay equalization. The same approach may be applied to alter the propagation delay in signal conductors that carry single-ended signals.

Further, although many inventive aspects are shown and described with reference to a daughter board connector, it should be appreciated that the present invention is not limited in this regard, as the inventive concepts may be included in other types of electrical connectors, such as backplane connectors, cable connectors, stacking connectors, power connectors, flexible circuit connectors, mezzanine connectors, or chip sockets.

As a further example, connectors with four differential signal pairs in a column were used to illustrate the inventive concepts. However, the connectors with any desired number of signal conductors may be used.

Also, though embodiments of connectors assembled from wafer subassemblies are described above, in other embodiments connectors may be assembled from wafers without first forming subassemblies. As an example of another variation, connectors may be assembled without using separable wafers by inserting multiple columns of conductive members into a housing.

Also, impedance compensation in regions of signal conductors adjacent regions of lower dielectric constant can be provided by altering the width of the signal conductors. Other impedance control techniques may be employed. For example, the signal to ground spacing could be altered adjacent regions of lower dielectric constant. Signal to ground spacing could be altered in any suitable way, including incorporating a bend or jag in either the signal or ground conductor or changing the width of the ground conductor.

Additionally, lossy material may be selectively placed within the insulative portions of backplane wafer subassembly 140 to reduce crosstalk, without providing an undesirable level attenuation for signals. Further, adjacent signals and grounds may have conforming portions so that in locations where the profile of either a signal conductor or a ground conductor changes, the signal-to-ground spacing may be maintained.

In the embodiments illustrated, some conductive elements are designated as forming a differential pair of conductors and some conductive elements are designated as ground conductors. These designations refer to the intended use of the conductive elements in an interconnection system as they would be understood by one of skill in the art. For example, though other uses of the conductive elements may be possible, differential pairs may be identified based on preferential coupling between the conductive elements that make up the pair. Electrical characteristics of the pair, such as its impedance, that make it suitable for carrying a differential signal may provide an alternative or additional method of identifying a differential pair. For example, a pair of signal conductors may have an impedance of between 75 Ohms and 100 Ohms. As a specific example, a signal pair may have an impedance of 85 Ohms+/−10%. As another example of differences between signal and ground conductors, in a connector with differential pairs, ground conductors may be identified by their positioning relative to the differential pairs. In other instances, ground conductors may be identified by their shape or electrical characteristics. For example, ground conductors may be relatively wide to provide low inductance, which is desirable for providing a stable reference potential, but provides an impedance that is undesirable for carrying a high speed signal.

Also, ground conductors of daughter card wafers are not shown with generally wide planar portions in the backplane wafer subassembly. However, the ground conductors of the daughter card wafers shown with two contact tails with planar portions could be incorporated in the daughter card wafers too. Such alterations, modifications, and improvements are intended to be part of this disclosure, and are intended to be within the spirit and scope of the invention. Accordingly, the foregoing description and drawings are by way of example only.

What is claimed is:

1. An electronic assembly comprising:
    a printed circuit board having a surface with a plurality of conductive pads disposed thereon and a plurality of conductive traces within the printed circuit board;
    an electrical connector comprising a housing and a plurality of conductive elements within the housing, each of the plurality of conductive elements comprising a surface mount contact tail extending from the housing, the housing being disposed adjacent to an area of the surface, the area comprising at least a portion of the plurality of conductive pads and the surface mount contact tail of each of the plurality of conductive elements being electrically connected to a pad of a first portion of the plurality of conductive pads;
    a plurality of electronic components, each electronic component having a first end and a second end, the first end of each of the plurality of electronic components being electrically connected to a pad of the first portion of the plurality of conductive pads and the second end of each of the plurality of electronic components being electrically connected to a pad of a second portion of the plurality of conductive pads; and
    a plurality of vias, each of the plurality of vias passing through a conductive pad of the second portion of the plurality of conductive pads and a conductive trace of the plurality of conductive traces.

2. The electronic assembly of claim 1, wherein the first portion of the plurality of conductive pads are free of vias.

3. The electronic assembly of claim 1, wherein the plurality of electronic components are disposed adjacent the housing.

4. The electronic assembly of claim 1, wherein the housing comprises a plurality of recesses and each of the plurality of electronic components is partially disposed within a recess of the plurality of recesses.

5. The electronic assembly of claim 1, wherein each of plurality of electronic components comprises a surface mount component.

6. The electronic assembly of claim 5, wherein each of plurality of electronic components comprises a capacitor.

7. The electronic assembly of claim 5, wherein each of plurality of electronic components comprises a resistor.

8. The electronic assembly of claim 1, wherein:
    the electrical connector comprises a plurality of wafer assemblies, each wafer subassembly comprising a portion of the housing and a portion of the plurality of conductive elements; and each of the plurality of electronic components is disposed between two adjacent wafer assemblies of the plurality of wafer assemblies.

9. An electrical connector comprising:
    a housing having a surface;
    a plurality of conductive elements each having an intermediate portion disposed within the housing and a contact tail extending from the housing adjacent the surface; and
    a plurality of electronic components separately formed from one another and attached to the surface of the housing, each of the plurality of electronic components comprising a conductive surface, and each of the plurality of components being disposed with the conductive surface adjacent a contact tail of a conductive element of the plurality of conductive elements.

10. The electrical connector of claim 9, wherein the conductive surface of each of the plurality of electronic components comprises a solder-wettable surface.

11. The electrical connector of claim 10, wherein:
    each of the plurality of electronic components comprises a first end and a second end;
    the conductive surface of each of the plurality of electronic components is a first conductive surface positioned at the first end of the electronic component; and
    each of the plurality of electronic components comprises a second conductive surface positioned at the second end of the electronic component.

12. The electrical connector of claim 11, wherein each of the plurality of electronic components is a surface mount capacitor.

13. The electrical connector of claim 12 in combination with a printed circuit board, wherein:
    the printed circuit board comprises a surface and a first plurality of conductive pads and a second plurality of pads disposed on the surface, each of the second plurality of pads being positioned adjacent a pad of the first plurality of pads;
    a contact tail of a conductive element of the plurality of conductive elements is soldered to a pad of the first plurality of pads; and
    a first conductive surface of an electronic component of the plurality of electronic components is soldered to a pad of the first plurality of pads and a second conductive surface of the electronic component is soldered to a pad of the second plurality of pads.

14. The electrical connector in the combination of claim 13, wherein:
    the printed circuit board comprises a plurality of conductive structures within the printed circuit board and a plurality of vias providing an electrical connection from the surface to a structure of the plurality of conductive structures;
    each pad of the second plurality of pads has a via of the plurality of vias passing therethrough; and
    each pad of the first plurality of pads has no via passing therethrough.

15. The electrical connector in the combination of claim 14, wherein:
    the plurality of conductive structures comprise signal traces and ground layers; and
    each of the plurality of vias provides a connection to a signal trace.

16. The electrical connector of claim 12, wherein each of the surface mount capacitors is an 0201 surface mount capacitor.

17. The electrical connector of claim 9, wherein each of the plurality of electronic components is attached to the housing with an adhesive.

18. The electrical connector of claim 9, wherein the housing comprises a plurality of recesses and each of the plurality of electronic components is at least partially disposed within a recess of the plurality of recesses.

19. The electrical connector of claim 18, wherein:
the electrical connector comprises a plurality of subassemblies, each subassembly comprising a housing portion and at least one column of conductive elements, the housing portion comprising a subset of the plurality of recesses, each recess of the subset being disposed adjacent a contact tail of a conductive element of the column; and
the first end of an electronic component of the plurality of electronic components is disposed within a recess of the subset.

20. The electrical connector of claim 9, wherein:
the plurality of conductive elements comprises a plurality of differential pairs; and
the plurality of conductive elements is each disposed with the conductive surface adjacent a contact tail of a conductive element of a differential pair of the plurality of differential pairs.

21. The electrical connector of claim 9, wherein:
the housing comprises a plurality of members, each of the plurality of members being adapted and configured to clip an electronic component of the plurality of electronic components to the housing in a position in which the conductive surface of the electronic component is adjacent a contact tail of a conductive element of the plurality of conductive elements.

22. The electrical connector of claim 9, wherein the plurality of electronic components are electrically isolated from the plurality of conductive elements.

23. A printed circuit board comprising a component footprint, the component footprint comprising:
a plurality of columns, each column comprising:
a plurality of first pairs of conductive pads disposed on a surface of the printed circuit board, each first pair comprising two adjacent pads and a via disposed in each pad;
a plurality of second pairs of conductive pads disposed on the surface of the printed circuit board, each second pair comprising two pads, wherein each of the second pairs of conductive pads comprises two adjacent pads without a via disposed in either pad; and
a plurality of conductive strips disposed on the surface of the printed circuit board, each conductive strip being disposed between two adjacent first pairs of conductive pads and between two adjacent second pairs of conductive pads.

24. The printed circuit board of claim 23, wherein each of the two adjacent pads of each second pair of conductive pads is adapted to electrically receive a conductive region of a capacitor.

25. The printed circuit board of claim 23, wherein one of the two adjacent pads of each second pair of conductive pads is adapted to electrically receive both a conductive region of a capacitor and a contact tail of an electrical connector.

26. The printed circuit board of claim 23, in combination with an electrical connector and a plurality of capacitors, wherein:
a capacitor of the plurality of capacitors is connected to a pad of the first plurality of pairs of pads and a pad of the second plurality of pairs of pads; and
a contact tail of the electrical connector is connected to each pad of the second plurality of pairs of pads.

27. An electrical connector comprising:
a housing having a surface;
a plurality of conductive elements each having an intermediate portion disposed within the housing and a contact tail extending from the housing adjacent the surface;
a plurality of electronic components attached to the surface of the housing, wherein each of the plurality of electronic components is electrically isolated from the plurality of conductive elements, and each of the plurality of components is disposed with the conductive surface adjacent a contact tail of a conductive element of the plurality of conductive elements.

28. The electrical connector of claim 27, wherein the plurality of electronic components comprise a plurality of surface mount components separately formed from one another.

29. The electrical connector of claim 27, wherein the plurality of electronic components are attached to the surface of the housing by a retention mechanism.

* * * * *